United States Patent [19]

Kudo

[11] Patent Number: 5,081,733
[45] Date of Patent: Jan. 21, 1992

[54] AUTOMATIC CLEANING APPARATUS FOR DISKS

[75] Inventor: Hideo Kudo, Fukushima, Japan

[73] Assignee: Shin-Etsu Handotai, Co., Ltd., Tokyo, Japan

[21] Appl. No.: 564,541

[22] Filed: Aug. 7, 1990

[30] Foreign Application Priority Data

Aug. 9, 1989 [JP] Japan ................................. 1-204821

[51] Int. Cl.⁵ ............................................. A46B 13/04
[52] U.S. Cl. ......................................... 15/77; 15/88.3; 15/102; 134/902
[58] Field of Search ...................... 15/21.1, 88.2, 88.3, 15/77, 102; 134/902

[56] References Cited

U.S. PATENT DOCUMENTS

| | | | |
|---|---|---|---|
| 3,970,471 | 7/1976 | Bankes et al. | 134/902 |
| 3,995,343 | 12/1976 | Homer | 15/77 |
| 4,062,463 | 12/1977 | Hillman et al. | 15/77 |
| 4,458,703 | 7/1984 | Inoue et al. | 134/902 |
| 4,506,687 | 3/1985 | Rosch III | 134/902 |

FOREIGN PATENT DOCUMENTS

2332547 6/1973 Fed. Rep. of Germany ...... 134/902

Primary Examiner—Edward L. Roberts
Attorney, Agent, or Firm—Whitham & Marhoefer

[57] ABSTRACT

An automatic cleaning apparatus for disks is provided with detachable sections including, in order, a workpiece feeder section, an isolation section, a scrubber section, a second isolator section, and a workpiece receiver section. Additional units of any section may also be assembled into the cleaning apparatus. Transfer of cleaning liquid from one section to another is minimized by adjustment of a weir on each section to establish a constant liquid level in each section. Additionally, turbulence at the opening from one section to another is reduced by use of a thin shutter closed by an apertured press piece. Improved arrangements for introducing workpieces into the cleaning fluid, scrubbing the workpieces, recovering the workpieces from the fluid and transporting the workpieces within the cleaning fluid are provided so that the entire scrubbing process can be carried out automatically and with minimum contamination or damage of the workpieces.

14 Claims, 22 Drawing Sheets

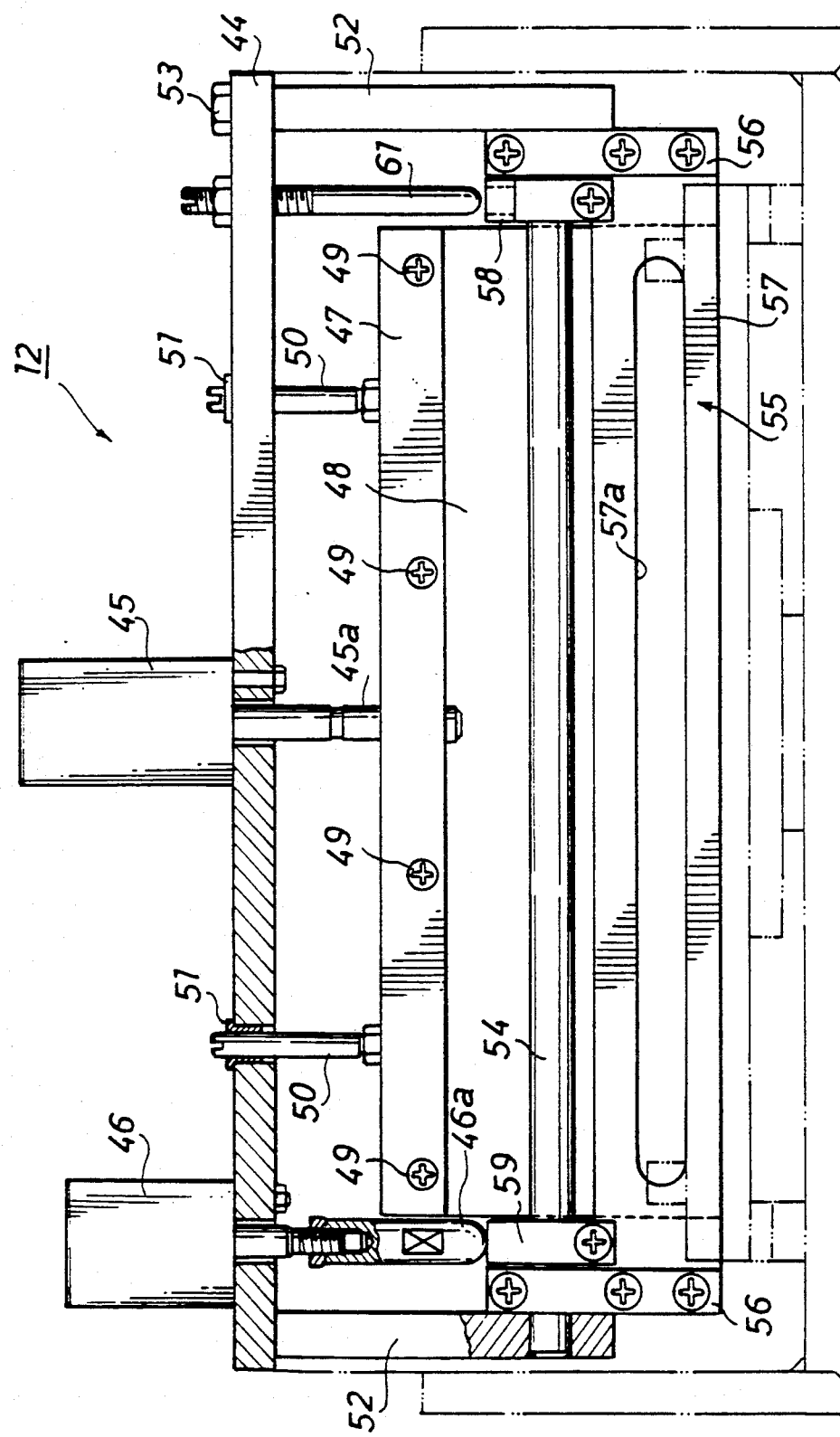

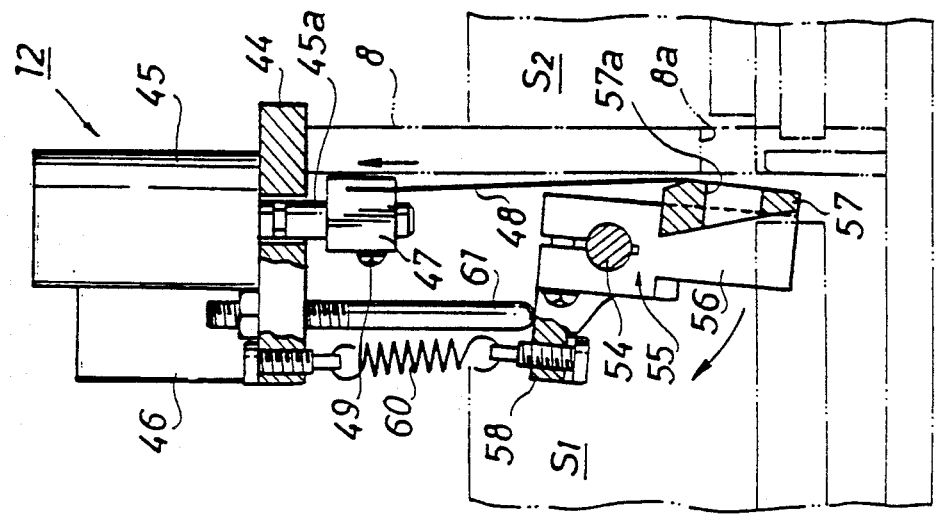
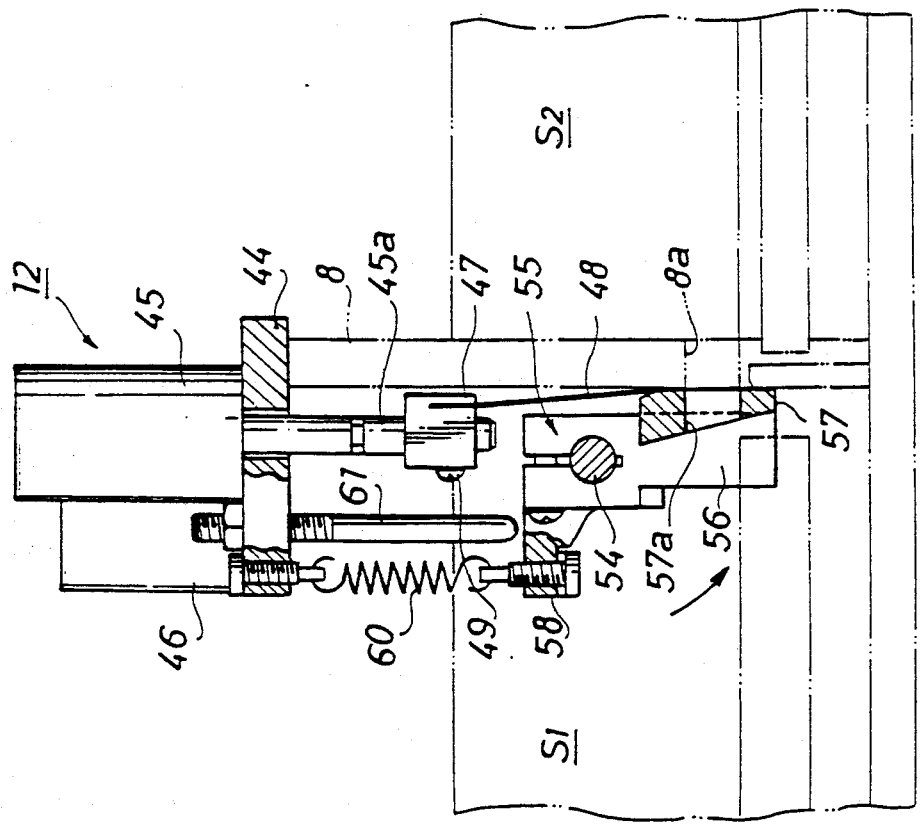

AUTOMATIC CLEANING APPARATUS FOR DISKS

BACKGROUND OF THE INVENTION

1. Field of the Invention

The present invention relates to an apparatus for automatically cleaning disks, such as semiconductor wafer workpieces which are in the shape of a thin circular disk.

2. Description of the Prior Art

In the semiconductor device manufacturing art, impurities adhering to the surfaces of the semiconductor wafers are known to adversely influence the properties of the resulting semiconductor devices.

Therefore, a cleaning step is included in the semiconductor wafer manufacturing process. In the cleaning step, the wafers are cleaned by various methods which are classified broadly into two groups: mechanical cleaning methods and chemical cleaning methods.

The mechanical cleaning methods include the brushing method wherein the impurities adhering to the wafer surfaces are directly brushed off by means of appropriate brushes, the flushing method wherein the impurities are removed from the wafer surfaces as pressurized fluid from an injection nozzle is applied to the wafer locally or entirely, the ultrasonic cleaning method wherein the wafers are submerged in a liquid and the impurities are vibrated to detach from the wafer surfaces as ultrasonic waves are applied to the wafers.

The chemical cleaning methods include the methods wherein the impurities adhering to the surfaces of the wafers are removed as they are chemically dissolved by various chemicals and enzymes. There are other cases wherein a chemical cleaning method is combined with a mechanical cleaning method.

When treated with any wet cleaning method described above, the wafers can well get rid of the impurities adhering to them. However, as the wafers thus cleaned are removed from the cleaning liquid and brought to the place of a next processing step, the remnant of the cleaning liquid wetting the wafer surfaces evaporates leaving the impurities acquired from the wafers deposited again on the wafers. Further, the impurities in the air also tend to adhere to the wafers.

Various proposals have been made relating to methods as well as apparatuses for cleaning the wafers (e.g., Japanese Patent Publication No. 52-34859 and Japanese Patent Publication No. 60-36099); however, no apparatus has been proposed which is capable of conducting a series of operations in a full automatic manner, starting with feeding of wafers, cleaning them, and recovering them in the end. The fact is that the entire series of the operations were conducted manually so that they required a tremendous amount of time and labor, and therefore improvement of operation efficiency and labor and cost saving have been earnestly desired.

SUMMARY OF THE INVENTION

The present invention was made in view of the above problems, and, therefore, it is an object of the invention to provide an automatic cleaning apparatus for disks such as semiconductor wafers workpieces which can effectively clean the disks, and is capable of conducting a series of operations in a fully automatic manner, starting with feeding of disks, cleaning them, and recovering them, in the end, so that it is possible to improve the operation efficiency and save the labor and cost.

In order to achieve the above object and others, the present invention proposes an apparatus for automatically cleaning workpieces which are in the shape of thin circular disk such as semiconductor wafers, which apparatus comprises the following sections connected in a row in the following order to form a fluid passage which is adapted to be interrupted at each connection:

a work feeder section equipped with a workpiece transportation means, for supplying the workpieces to be cleaned one after another into the fluid passage in a manner such that each workpiece is always kept in a liquid, a first isolator section equipped with a workpiece transportation means, for isolating a scrubber section from the workpiece feeder section by means of a liquid, the scrubber section equipped with a workpiece transporation means and a scrub means which is adapted to receive the workpieces and clean both faces, at once, of the workpieces within a liquid, a second isolator section equipped with a workpiece transportation means, for isolating a workpiece receiver section from the scrubber section by means of a liquid, through which the workpiece is transported, and the work receiver section equipped with a workpiece transportation means, for receiving the cleaned workpiece within a liquid through which the workpiece is transported, and recovering the same from the liquid.

In an embodiment of the invention, the workpiece feeder section, the scrubber section, the first and second isolator sections, and the workpiece receiver section are detachable units connected in a row to form the passage which can be interrupted at each connection by means of a shutter device provided at each connection.

Furthermore, the shutter device preferably comprises:

a valve sheet made of a film normally held in parallel with the partition wall at each connection and adapted to open and close an opening made in a partition wall by shifting in a direction parallel with the partition wall across the opening, a press means for pressing the vave sheet over the opening in the partition wall to hermetically close the opening, and a drive means for driving the press means and the valve sheet.

It is also preferred that the scrub means comprises a pair of rotary brushes having axes of rotation parallel with each other and adapted to receive the workpiece therebetween and clean the work by turning in opposite directions about their axes, a first workpiece drive means to rotate the workpiece horizontally between the rotary brushes, and a second workpiece drive means to reciprocate the workpiece horizontally through a predetermined amplitude of stroke.

Still more preferably, the workpieces receiver section is equipped with a bucket for recovering the workpiece within the liquid and a pair of ramped stationary cam means, which bucket comprises a vertically shiftable support member and a bag-shaped recovery member which is pivotally supported by the support member, and pivotally supporting a pair of guide rollers at its lower end placed on the cam means, and adapted to assume a vertical off-liquid position and a horizontal in-liquid position, and which cam means are so profiled that as the guide rollers roll along the cam means the bag-shaped recovery member shifts from the vertical off-liquid position to the horizontal in-liquid position, or vice versa.

According to the invention, the inventive apparatus is equipped with such facilities that enable fully automated operation of cleaning the workpieces, starting with inputting of the workpieces and ending with the recovery of the workpieces after cleaning them. Especially, at the scrubber section, since the both faces of each workpiece is simultaneously cleaned by means of the pair of rotary brushes, the cleaning of the workpieces can be conducted highly effectively within a reduced period of time, so that the operation efficiency and cleaning capacity are improved and the total cleaning operation is economized.

Also, according to the invention, each workpiece is always kept in liquid throughout the whole series of the cleaning operations beginning with the inputting of the workpiece into the apparatus and ending with the recovery of the workpiece after cleaning it, so that the workpiece is prevented from drying, and as a result, the workpiece is effectively kept clean of dusts and scars.

BRIEF DESCRIPTION OF THE DRAWINGS

For a further understanding of the invention, reference is made to the following description taken in connection with the accompanying drawings, in which:

FIG. 8 is a partially broken-off front view of a shutter device;

FIG. 9 is a sectional side view of the same shutter device of FIG. 8;

FIG. 10 is a drawing similar to FIG. 9 to show the operation of the same shutter device;

DETAILED DESCRIPTION OF THE PREFERRED EMBODIMENT

An embodiment of the invention will now be described with reference to the attached drawings.

Figure 1:
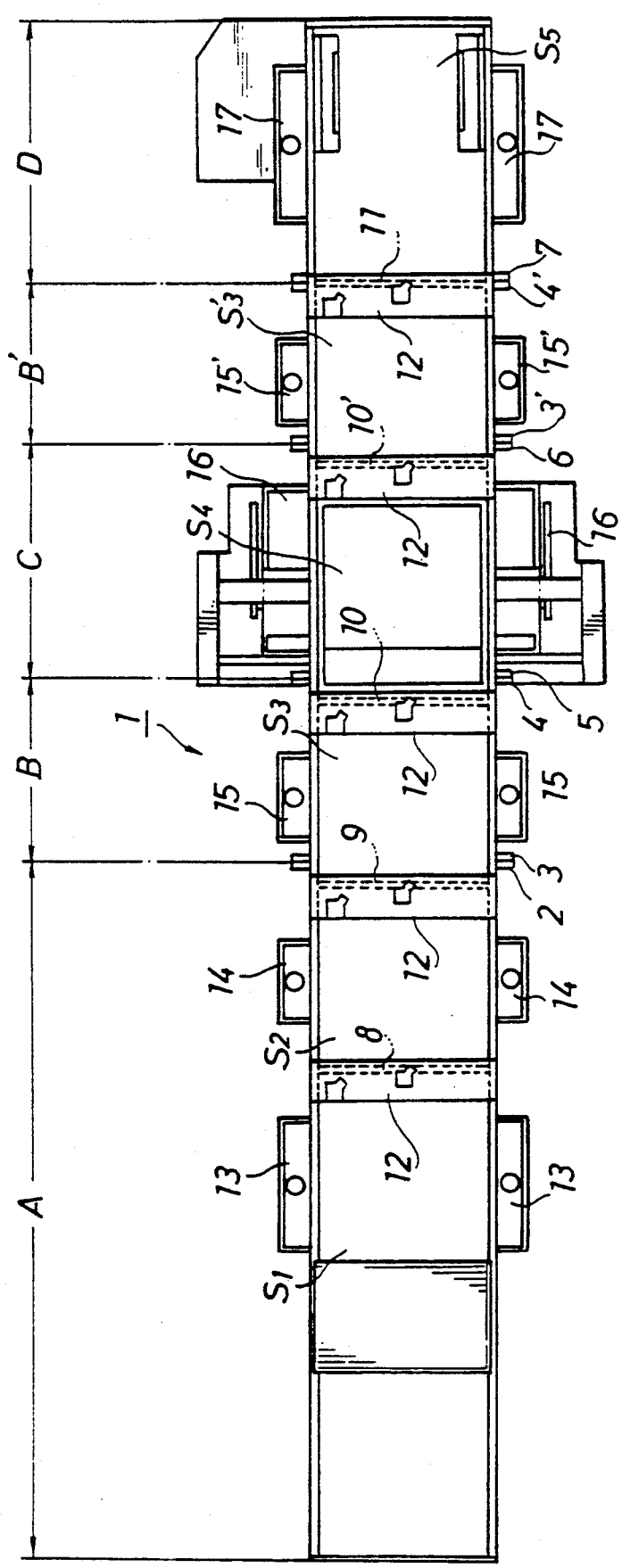
FIG. 1 is a plan view of an automatic cleaning apparatus according to the invention.
Figure 2:
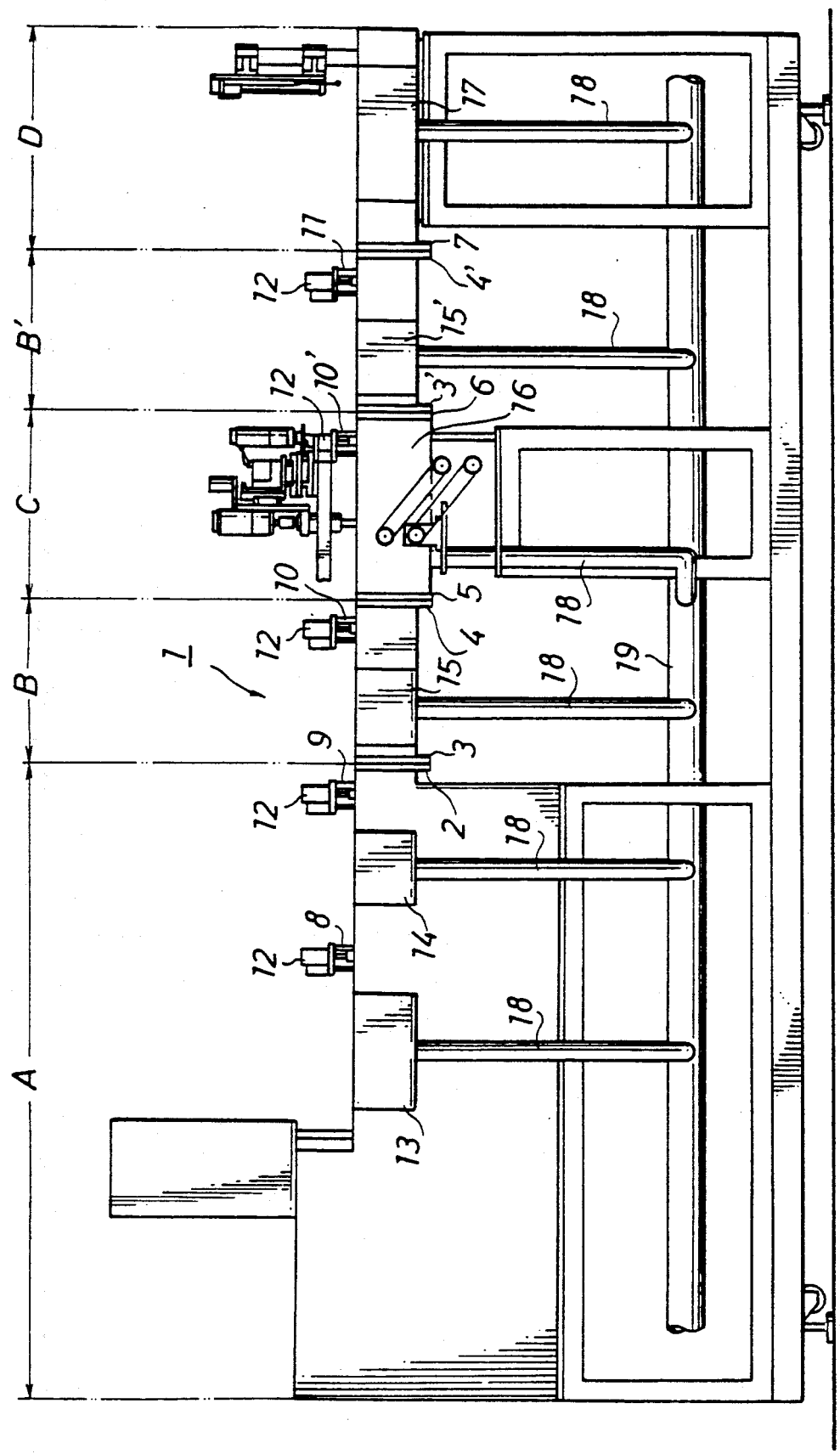
FIG. 2 is a side view of the same apparatus of FIG. 1.

FIG. 1 is a plan view of an automatic cleaning apparatus according to the invention, and FIG. 2 is a side view of the same apparatus. The automatic cleaning apparatus 1 consists of a wafer feeder section A, a first isolator section B, a scrubber section C, a second isolator section B', and a wafer receiver section D, which are arranged in this order. These sections each constitute detachable units which are connected to the adjoining units by means of flanges. In particular, by connecting flanges 2 and 3 together, the wafer feeder section A is connected to the first isolator section B. Similarly, by coupling together flanges 4 and 5, flanges 6 and 3', and flanges 4' and 7, respectively, the first isolator section B, the scrubber section C, the second isolator section B', and the wafer receiver section D are connected in a row of this order so that they make one integral body.

Containers S1 and S2 divided by a partition wall 8 are provided in the wafer feeder section A; a container S3 is provided in the first isolator section B; a container S4 is provided in the scrubber section C; a container S3' is provided in the second isolator section B'; and a container S5 is provided in the wafer receiver section D. Pure water is contained in the containers S1, S2, S3, S3', and S5; a cleaning liquid is contained in the container S4. The containers S2 and S3 are divided by a partition wall 9; S3 and S4 by a partition wall 10; S4 and S3' by a partition wall 10'; S3' and S5 by a partition wall 11, respectively. Each partition wall is equipped with a slit opening (described later) which is opened and closed by means of a shutter device 12 so that the adjoining containers are in communication with each other when the opening between them is opened.

On either side of the container S1 are provided tanks 13 for receiving and recovering that pure water or cleaning water which overflows from the container S1. Similarly, containers S2, S3, S4, S3', and S5 are each flanked by tanks 14, 15, 16, 15', and 17, respectively. As shown in FIG. 2, the tanks 14, 15, 16, 15', and 17 each are equipped with drainage pipes 18 which extend downward and are all connected to a horizontally running main pipe 19.

Figure 3:
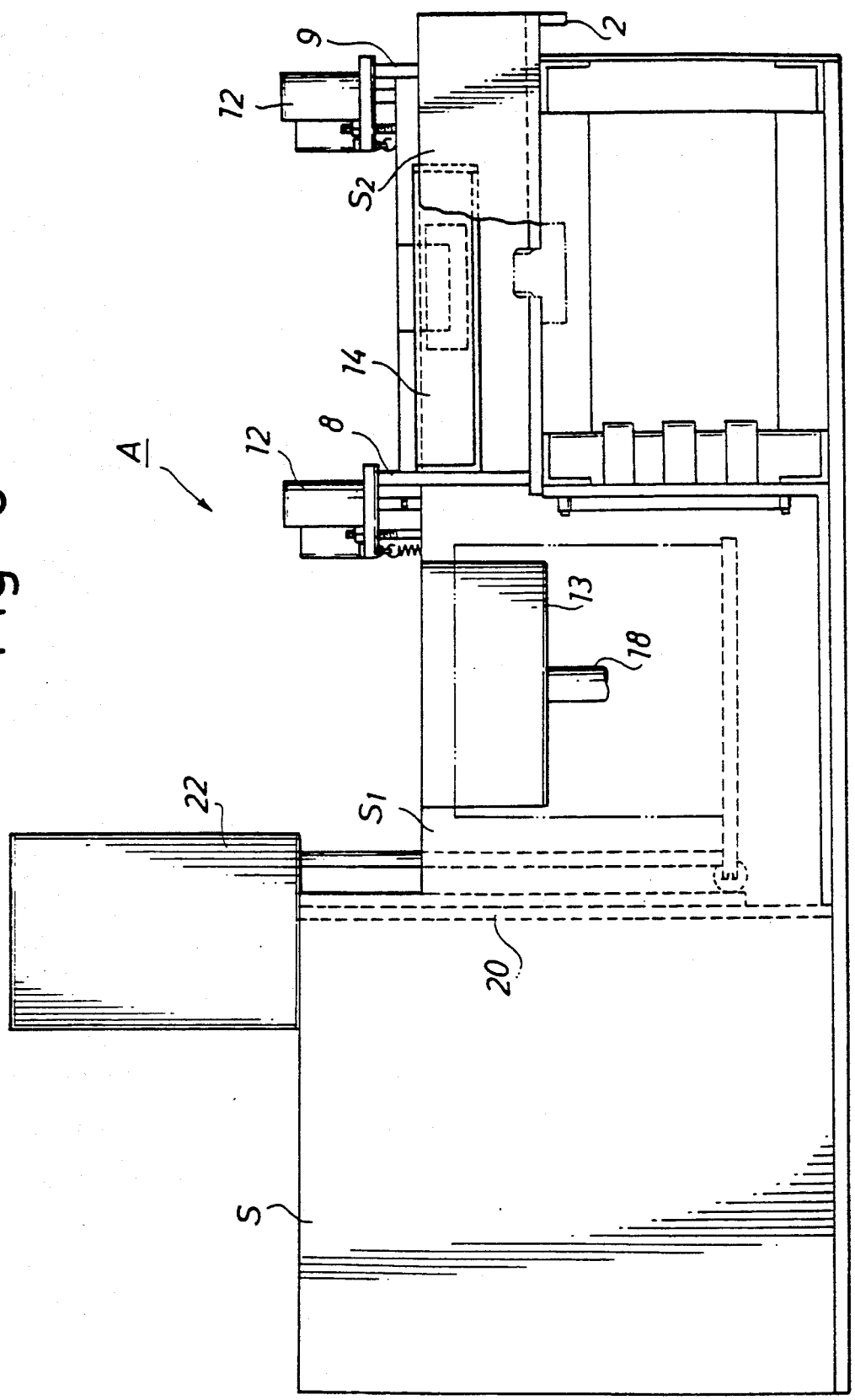
FIG. 3 is a side view of the upper part of a wafer feeder section.
Figure 4:
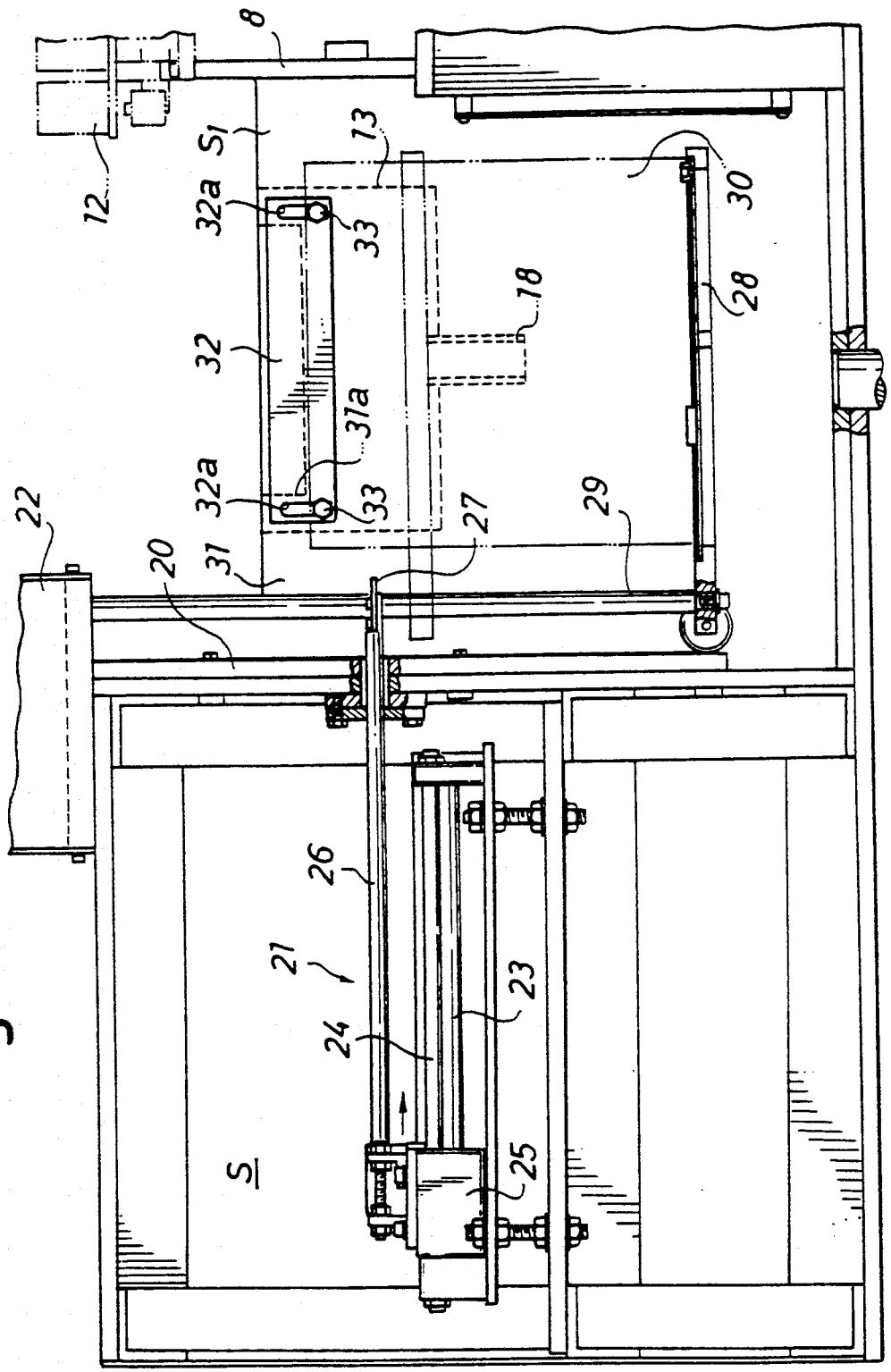
FIG. 4 is a sectional side elevation of the principal part of the wafer feeder section.
Figure 5:
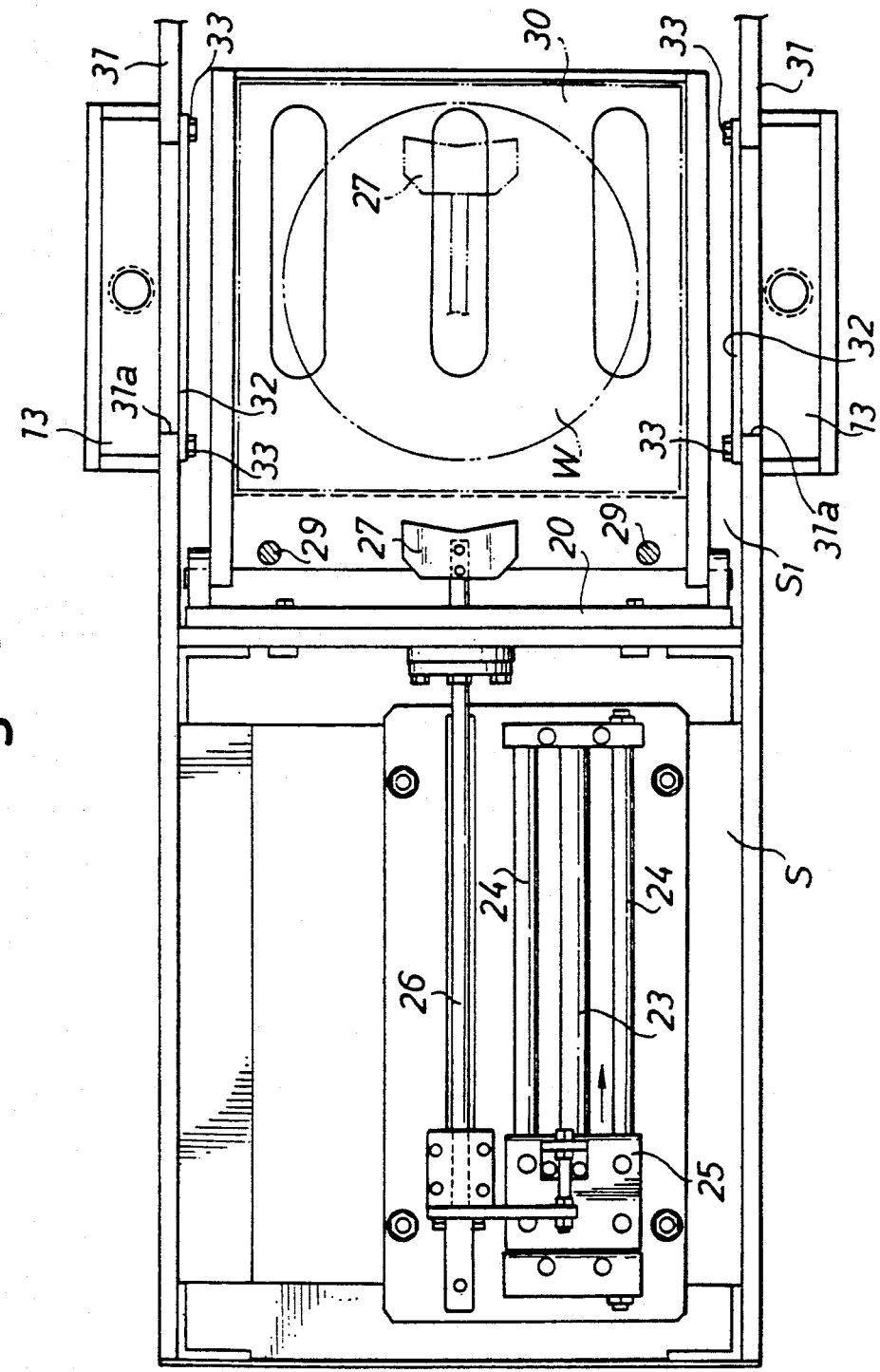
FIG. 5 is a plan view of the principal part of the wafer feeder section.
Figure 6:
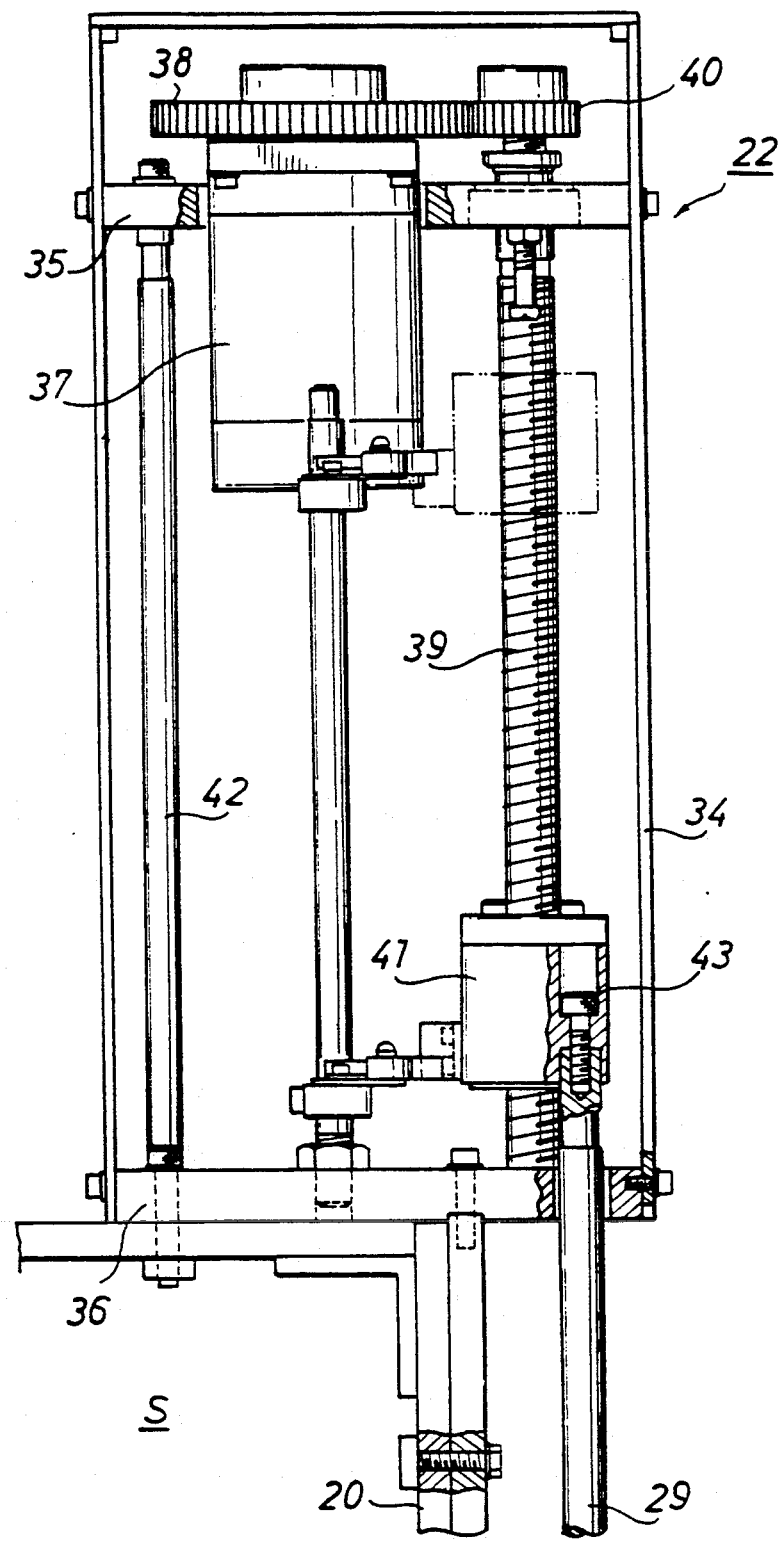
FIG. 6 is a partially broken-off side view of a drive mechanism of a cassette mount.
Figure 7:
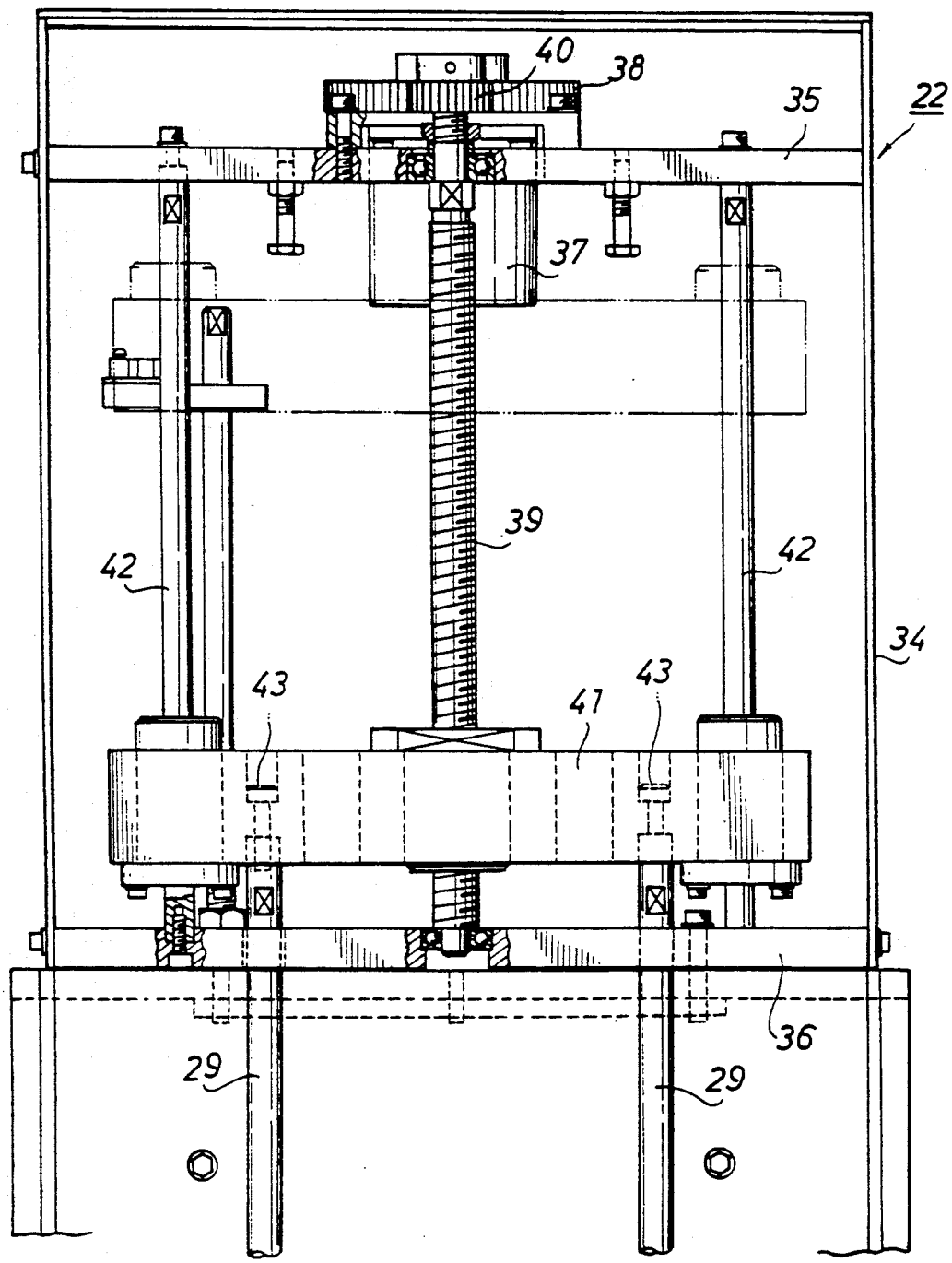
FIG. 7 is a partially broken-off front view of the same drive mechanism of FIG. 6.

Now, the construction of the wafer feeder section A will be described in detail with reference to FIGS. 3 through 10. Incidentally, FIG. 3 is a side view of the upper part of the wafer feeder section A; FIG. 4 is a sectional side elevation of the principal part of the wafer feeder section A; FIG. 5 is a plan view of the principal part of the wafer feeder section A; FIG. 6 is a partially broken-off side view of a drive mechanism of a cassette mount; FIG. 7 is a partially broken-off front view of the same drive mechanism; FIG. 8 is a partially broken-off front view of a shutter device; FIG. 9 is a sectional side view of the same shutter device; and FIG. 10 is a drawing similar to FIG. 9 to show the operation of the same shutter device.

In the wafer feeder section A, as shown in FIG. 3, to the left of the container S1 is formed a space S partially defined by a partition wall 20, and in this space S is provided a pusher 21. Also, a cassette mount drive mechanism 22 is fixed on the partition wall 20. Incidentally, in FIG. 3, the reference numeral 8 designates a partition wall, 12 designates shutter devices, 13 and 14 tanks, and S1 and S2 containers.

Now, the construction of the pusher 21 will be described in detail with reference to FIG. 4 and FIG. 5, in which reference numeral 23 designates a known rodless cylinder, which has a slider 25, which shifts sliding along the rod guides 24. A push rod 26 is attached to the slider 25. This push rod 26 penetrates the partition wall 20 and disposes its end in the container S1. Fixed at said end of the push rod 26 is a pusher plate 27, which is adapted to come in contact with the outer periphery of a wafer W, shown in FIG. 5.

A pair of rods 29, 29 extend vertically downward from the drive mechanism 22, and are capable of shifting up and down; a horizontal cassette mount 28 housed in the container S1 is fixed at the lower end of the rods 29. On the cassette mount 28 is mounted a cassette 30 which contains a large number of wafers W, one wafer above the other with a regular space between them.

Side walls 31, 31, which partially form the container S1, each have a rectangular cutaway port 31a, which provides an overflow passage from the container S1 to the tank 13, as shown in FIG. 4 and FIG. 5. On the inside of the side wall 31 and across the cutaway port 31a is provided a rectangular weir plate 32, which can be shifted up and down for adjustment of the weir height. In particular, along and near either vertical side of the weir plate 32 is formed a slit 32a having round ends, and in each slit 32a a bolt 33 is provided to fix the weir plate 32 on the side wall 31.

Next, the construction of the cassette mount drive mechanism 22 will be described in detail with reference to FIG. 6 and FIG. 7. In the drawings, reference numeral 34 designates a frame in which an upper base plate 35 and a lower base plate 36 are fixed horizontally. A drive motor 37 is supported by the upper base plate 35, and a large-diameter gear 38 is fixed about the output shaft extending upward from the drive motor 37. Also, a vertical ball screw shaft 39 is supported between the upper and lower base plates 35, 36 in a manner such that the ball screw shaft 39 can freely spin. A small-diameter gear 40, which meshes with the gear 38, is fixed about the top end of the ball screw shaft 39, which is disposed above the base plate 35. A slider 41 is threadably penetrated by and thus engaged with the ball screw shaft 39 in a manner such that when the ball screw shaft 39 turns, the slider 41 shifts vertically, guided by the rod guides 42, 42 provided vertically between the base plates 35, 36. Incidentally, the rods 29, 29 are vertically attached to the slider 41 by means of bolts 43, 43.

Next, the construction of the shutter device 12 will be explained in detail with reference to FIGS. 8 through 10.

As shown in the drawings, a horizontal base plate 44 is provided on top of the partition wall 8, and an air cylinder 45 and an air cylinder 46 are provided on the base plate 44 at the middle and near one end of the plate 44, respectively. A shutter body 47, which extends horizontally in the direction of the width of the container S1, is fixed to the rod 45a extending downward from the air cylinder 45. A thin valve sheet 48 made of polyether-ether ketone (PEEK) film is fixed at its upper edge of the shutter body 47 by means of screws 49. Incidentally, vertical rod guides 50, 50 are connected to the upper side of the shutter body 47 at locations close to the ends thereof, and are received in the base plate 44 via guide bushes 51, 51 in a manner such that the rod guides 50, 50 penetrate the base plate 44 and slide freely therein.

As shown in FIG. 8, vertical support plates 52, 52 are fixed at the ends of the base plate 44 by means of bolts 53. A horizontal shaft 54 is held by and between the support plates 52, 52 in a manner such that the shaft 54 is freely rotatable. A press body 55 is fixed about the shaft 54. This press body 55 consists of plates 56, 56 fitted at the ends of the shaft 54 and a press piece 57 held between the plates 56, 56. This press piece 57 is made of polyether-ether ketone (PEEK), and has a slit opening 57a in the middle of it which 57a has a similar dimension as a wide slit opening 8a made in the partition wall 8.

Arms 58 and 59 are fixed on the shaft 54 at locations immediately inside the plates 56, 56, and a spring 60 is provided between the arm 58 and the base plate 44. As shown in FIG. 8, the lower end of a rod 46a extending downward from the air cylinder 46 is abutted on the upper face of the arm 59.

A vertical stopper 61 supported by the base plate 44 is disposed above the arm 58. Incidentally, this stopper 61 is for restriction of the rotary movement of the shaft 54 and the press body 55 provided on the shaft 54.

Figure 11:
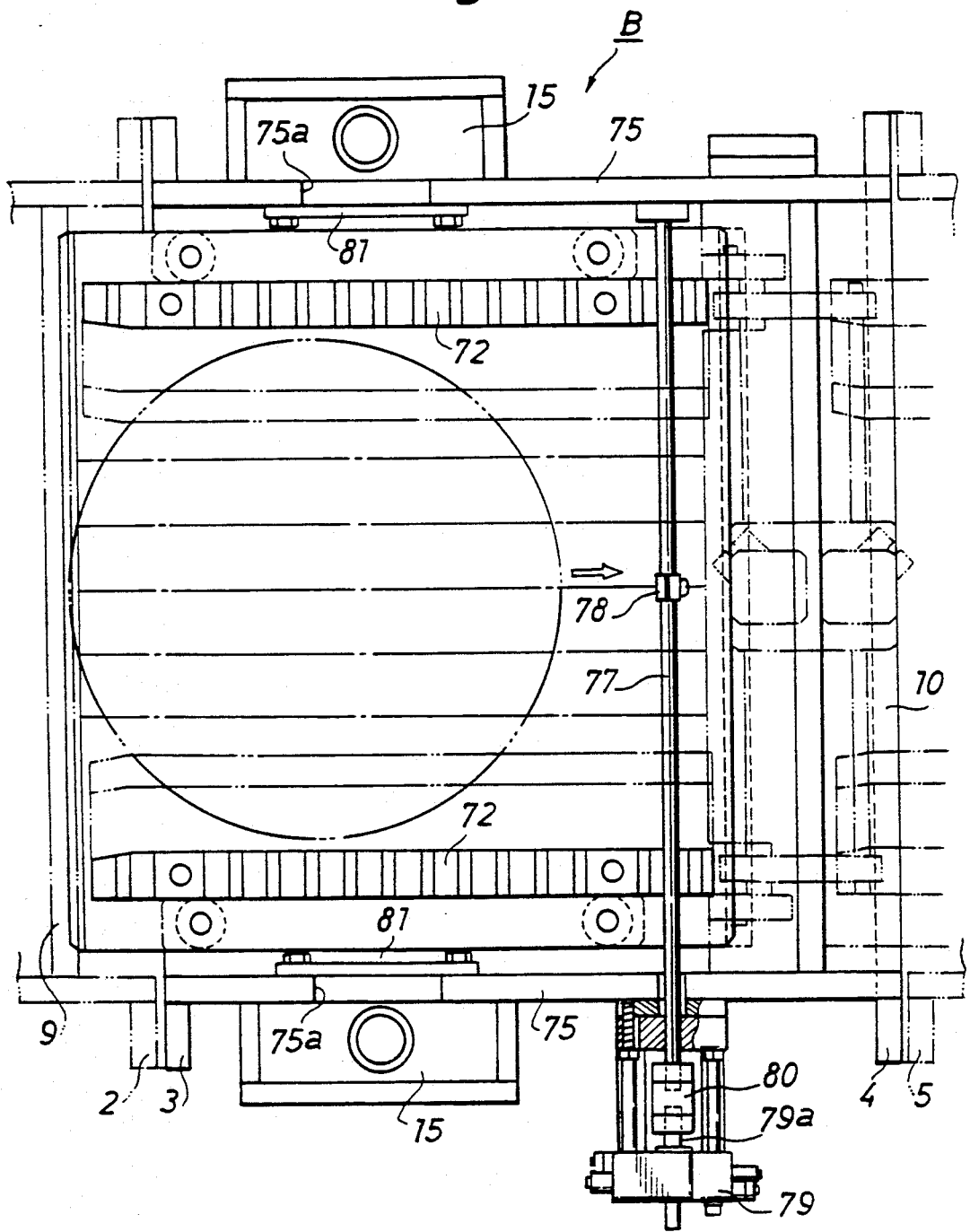
FIG. 11 is a partially broken-off plan view of an isolator section.

Next, the construction of the isolator section B will be described in detail with reference to FIG. 11 and FIG. 12. FIG. 11 is a partially broken-off plan view of the isolator section B and FIG. 12 is a partially broken-off side view of the same.

A transportation mechanism 62 and a stopper mechanism 63 are installed in the bottom of the container S3, which is defined between the partition walls 9 and 10. The transportation mechanism 62 is adapted to transport a wafer W in the direction indicated by the arrow in the drawings by means of a fluid jet. The stopper mechanism 63 is adapted to receive the transported wafer W and pass the wafer W through the shutter device 12 at an appropriate timing. To facilitate timely passing of the wafer W through the shutter device 12, the stopper mechanism 63 is interlocked with the shutter device 12 so that the movement of the stopper mechanism 63 is related to the movement of the shutter device 12 the by means of an interlock mechanism.

Figure 12:
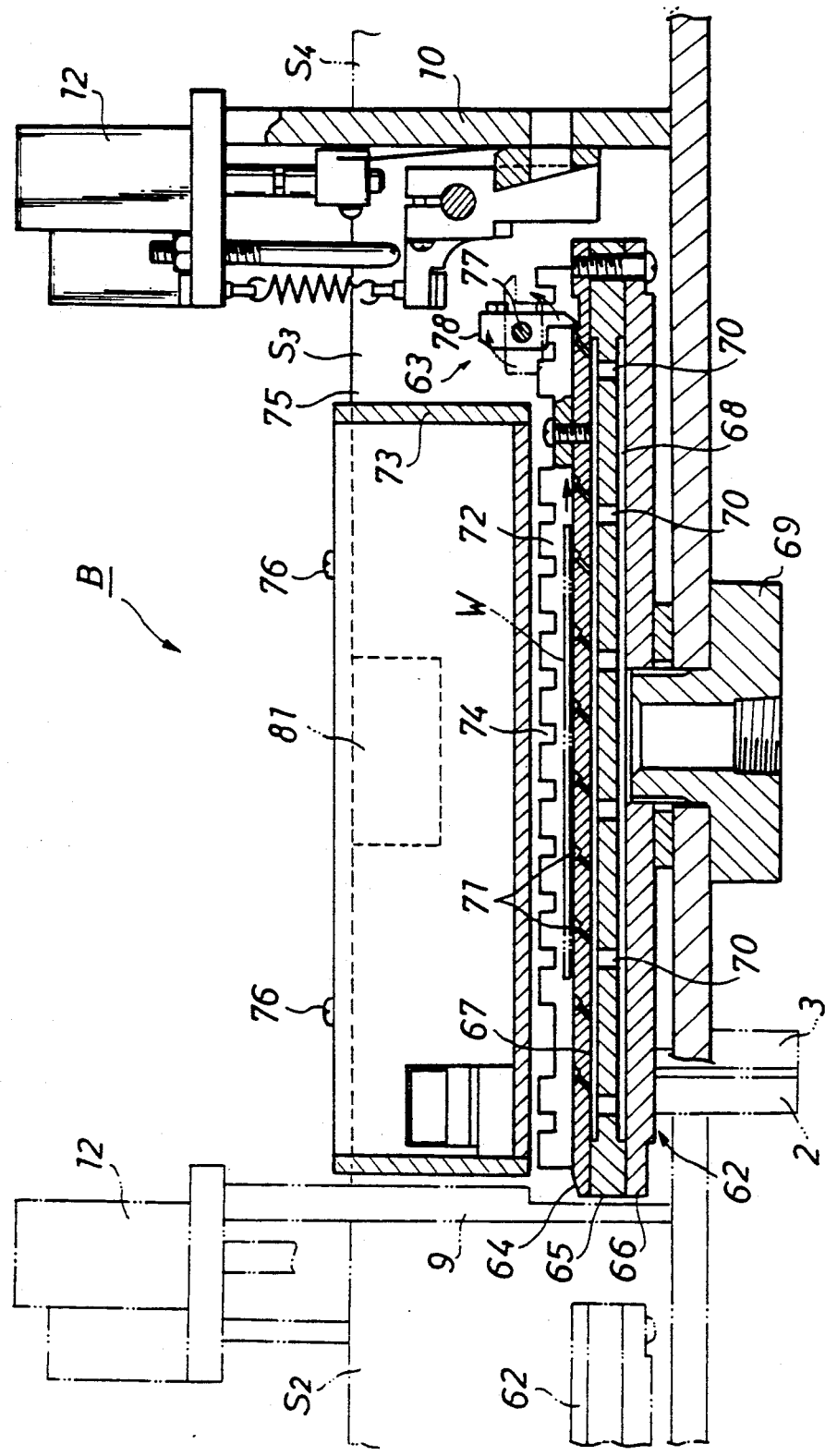
FIG. 12 is a partially broken-off side view of the same isolator section.

As shown in FIG. 12, the transportation mechanism 62 comprises a pile of three rectangular plates 64, 65, 66. A fluid passage 67 is formed between the plates 64 and 65, and a fluid passage 68 is formed between the plates 65 and 66. A flange 69 opens in the fluid passage 68, and thus the fluid passage 68 is in communication with a pressurized water supply source (not shown) by way of a pipe (not shown) connected to the flange 69.

A large number of circular through-holes 70 are made in the plate 65 so that the fluid passages 67 and 68 are always in communication with each other. Numerous jet holes 71 are made in the plate 64 which are slanted in a direction such that the jet fluid ejected from those holes urges the wafer W in the direction indicated by the arrow in FIG. 12. Also, a pair of parallel guide plates 72, 72 having a labyrinthine profile and extending in the direction of wafer transportation are provided to flank the plate 64 so as to guide the wafer W.

Thus, over the transportation mechanism 62 is formed a fluid passage 74 between the transportation mechanism 62 and a lid member 73 in the shape of a box, and the wafer W is made to pass in this passage 74. The lid member 73 is fixed to the top portions of the side walls 75, 75 of the container S3 by means of bolts 76.

Incidentally, a similar transportation mechanism 62 (shown in FIG. 12 in two-dot chain line) is also provided in the container S2 of the wafer feeder section A.

The stopper mechanism 63 is provided upstream to the partition wall 10, and consists of a horizontal rotatively shaft 77 which is held by and between the side walls 75, 75 of the container S3 and a stopper member 78 fixed about the shaft 77 at the middle thereof. One end of the shaft 77, as shown in FIG. 11, penetrates and extends beyond one of the side walls 75, and is connected via a coupling 80 to the output shaft 79a of a rotary actuator 79 fixed on said side wall 75.

Side walls 75, 75 each have a rectangular cutaway port 75a, which provides an overflow passage from the container S3 to the tank 15. On the inside of the side wall 75 and across the cutaway port 75a is provided a rectangular weir plate 81, which can be shifted up and down for adjustment of the weir height.

By the way, the construction of the isolator section B' is exactly the same as that of the isolator section B described above, so that the explanation of the former is omitted.

Figure 15:
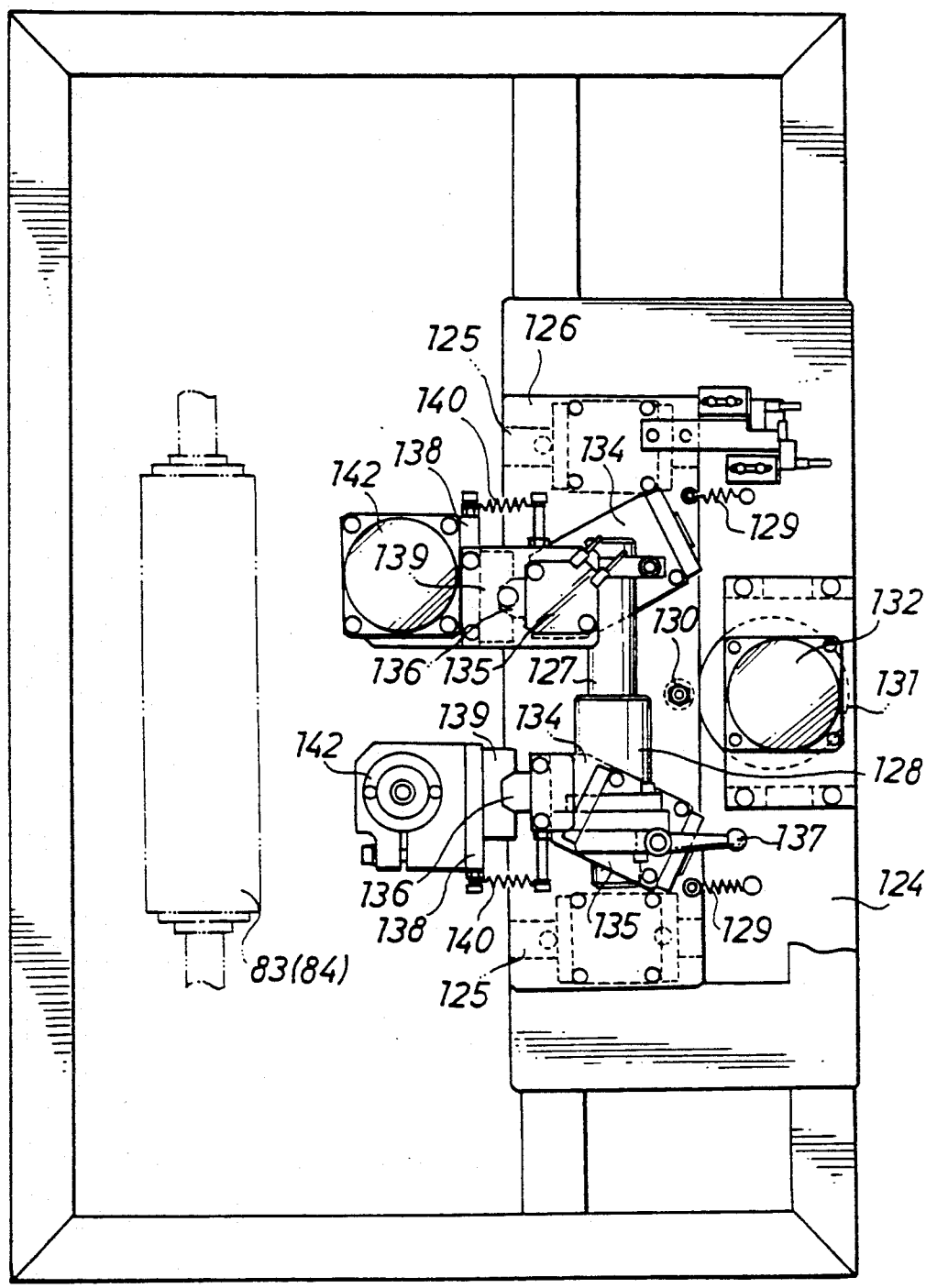
FIG. 15 is a plan view of the same scrubber section.
Figure 16:
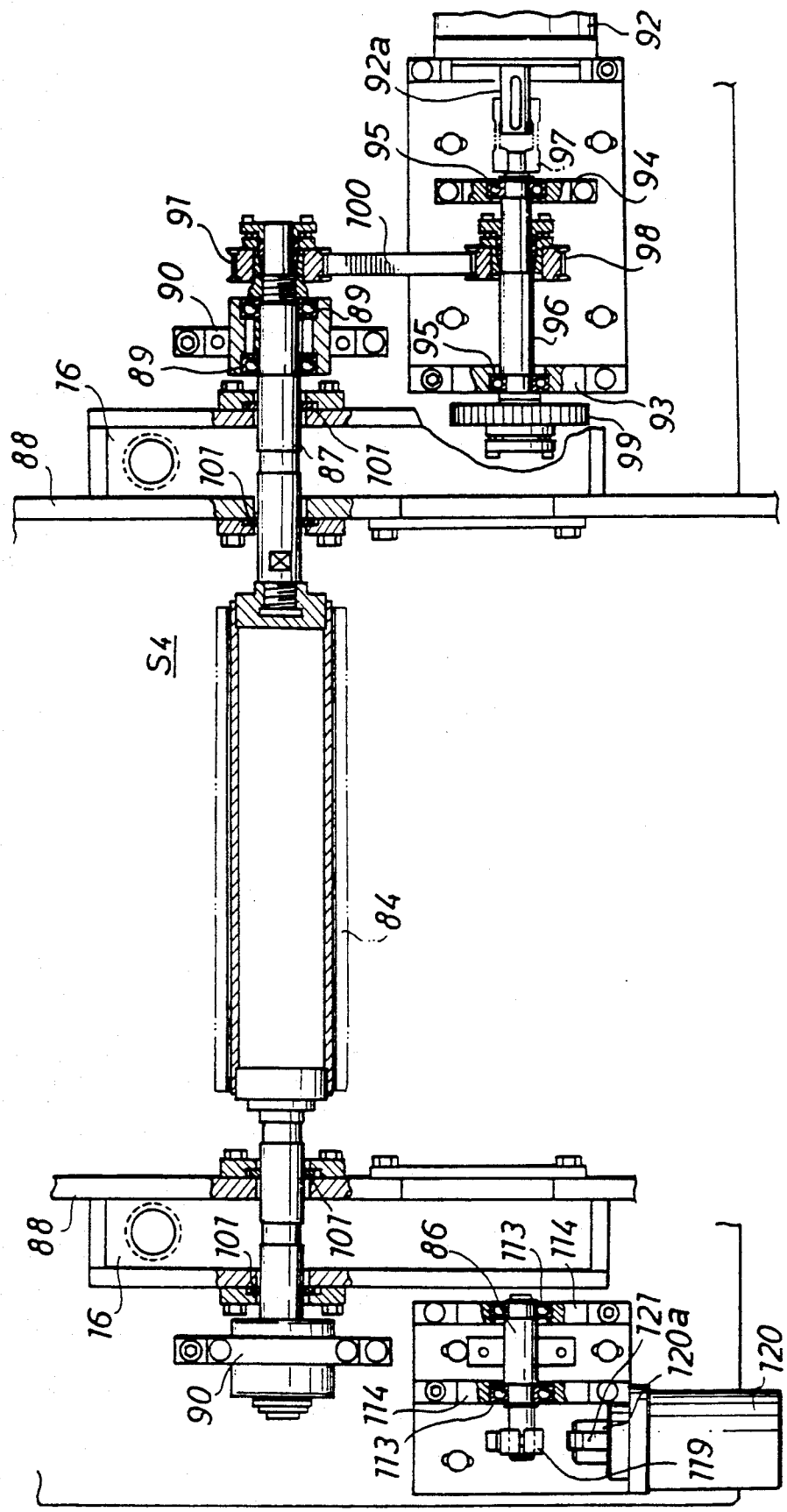
FIG. 16 is a partially broken-off plan view showing the drive mechanism of a rotary brush of the same scrubber section.
Figure 17:
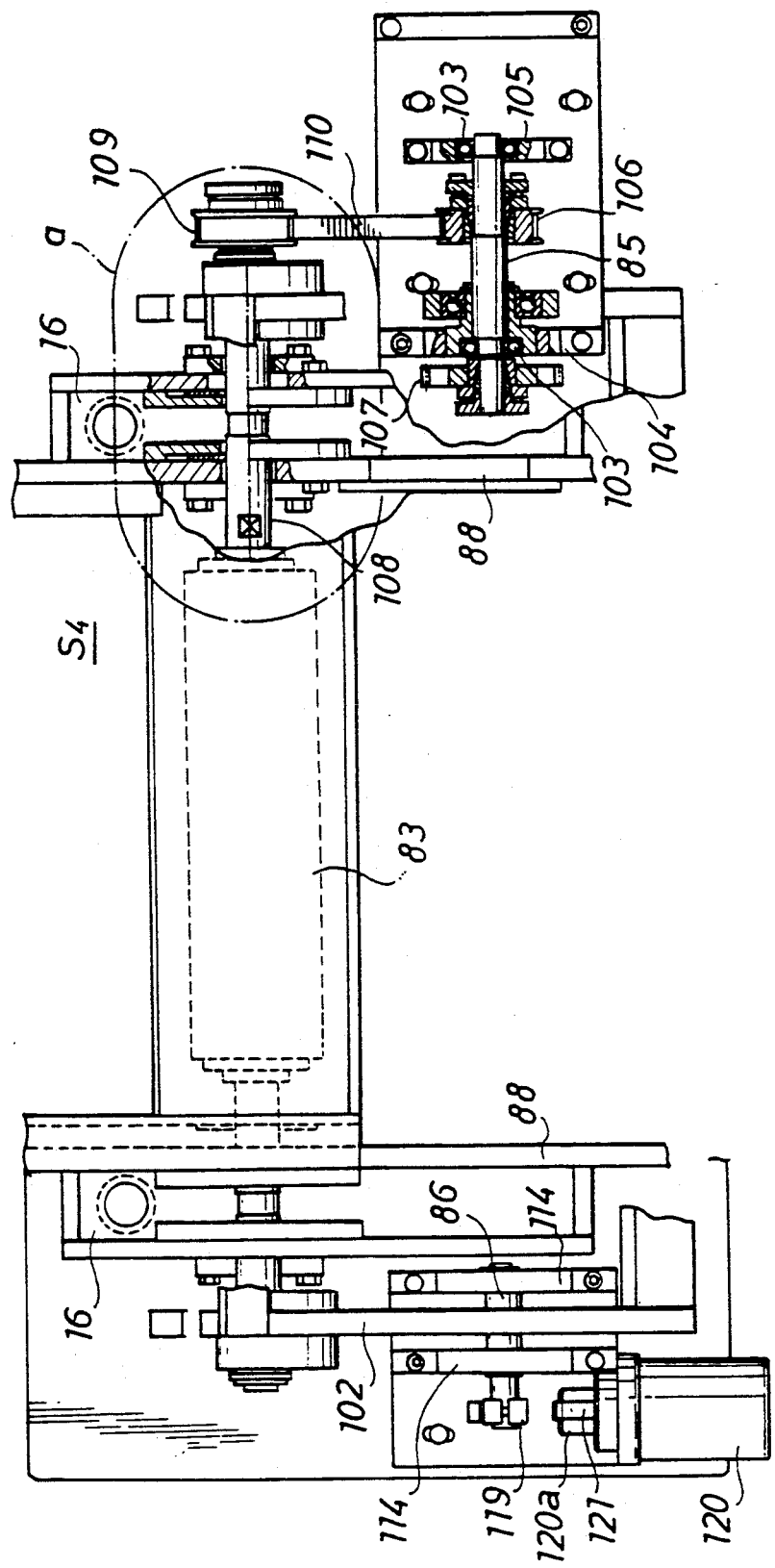
FIG. 17 is a partially broken-off plan view showing the drive mechanism of the rotary brush of the same scrubber section.
Figure 18:
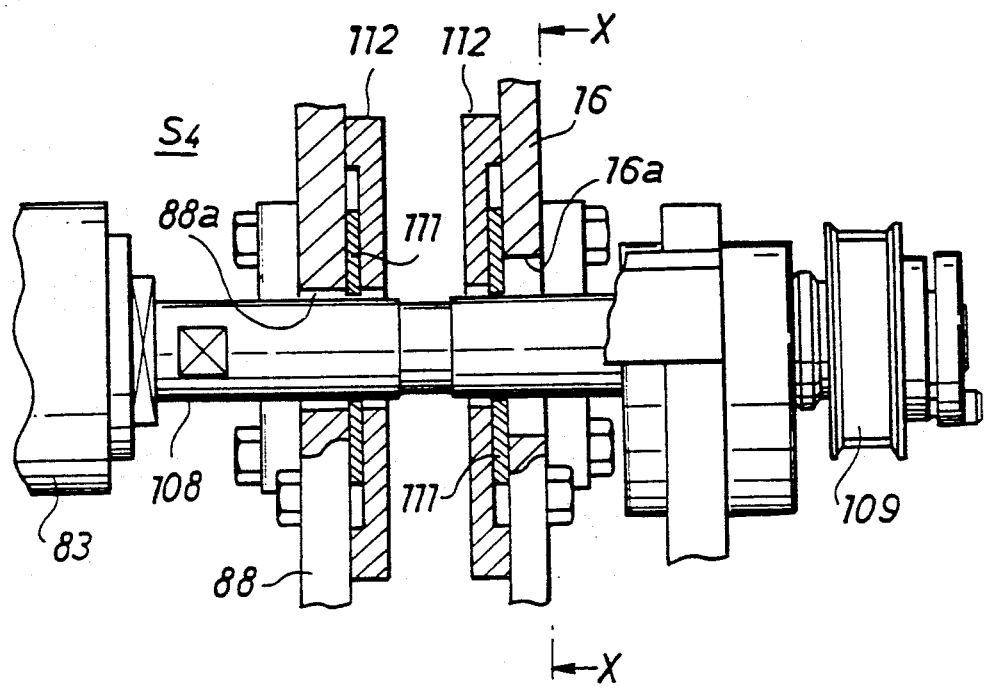
FIG. 18 is an enlarged view of the part a (shaft seal part) of FIG. 17.
Figure 19:
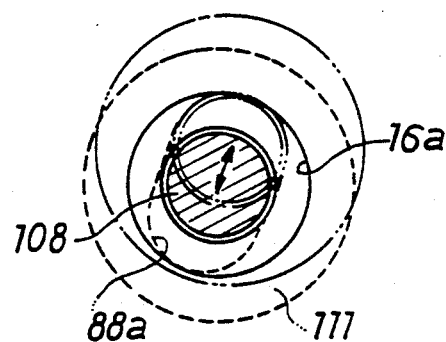
FIG. 19 is a cross section taken on line X—X of FIG. 18.

Next, the construction of the scrubber section C will be described in detail with reference to FIGS. 13 through 19. Incidentally, FIG. 13 is a partially broken-off side view of the scrubber section C, FIG. 14 is a partially broken-off side view of the principal part of the scrubber section C, FIG. 15 is a plan view of the same scrubber section, FIG. 16 and FIG. 17 are partially broken-off plan views showing the drive mechanism of a rotary brush of the same scrubber section C, FIG. 18 is an enlarged view of the part a (shaft seal part) of FIG. 17, and FIG. 19 is a cross section taken on line X—X of FIG. 18.

Figure 14:
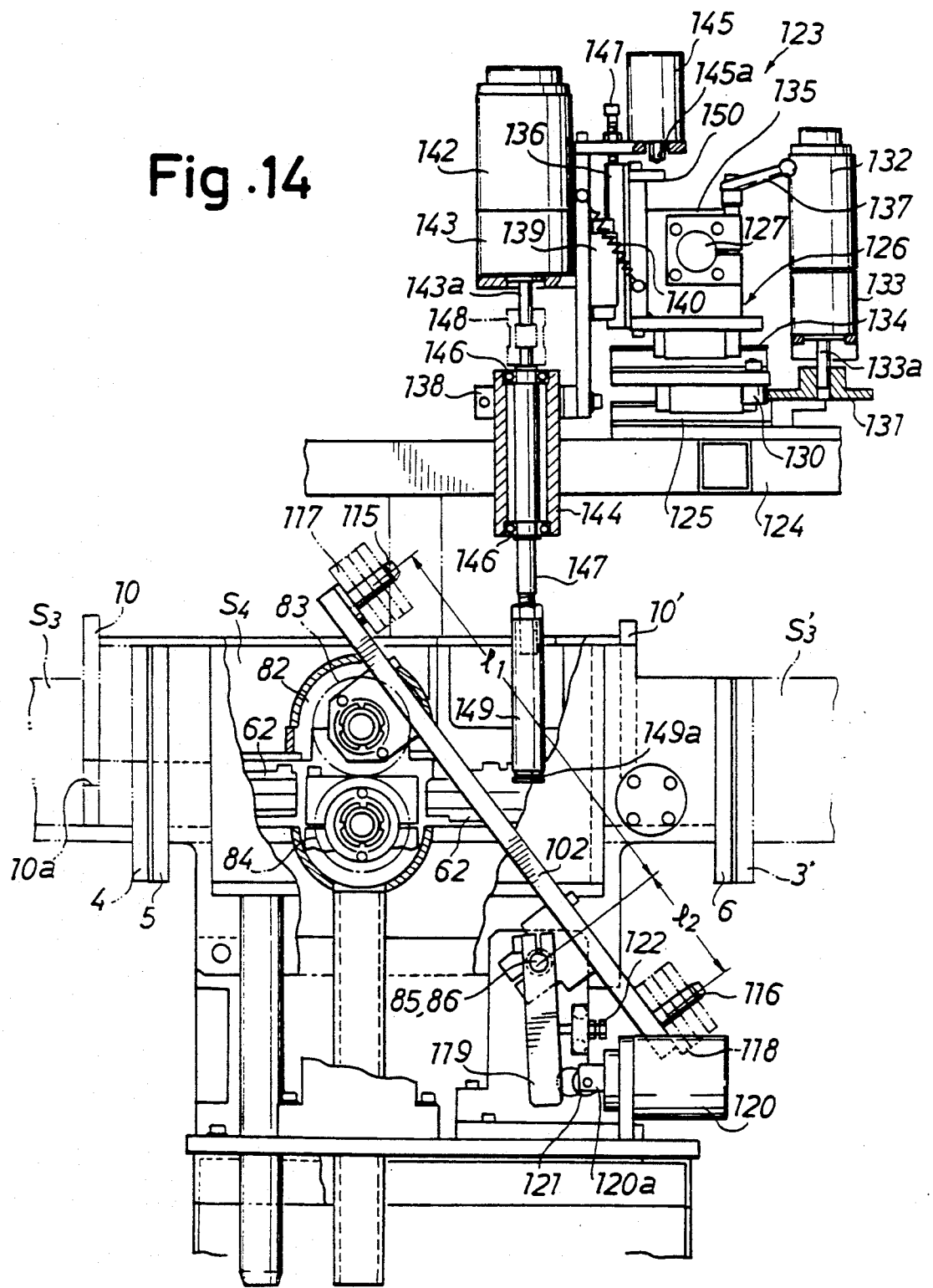
FIG. 14 is a partially broken-off side view of the principal part of the scrubber section.

As shown in FIG. 14, a space 82 having a elliptic cross section and extending in the direction normal to the plane of the sheet of FIG. 14, is formed in the container S4 partially defined by the partition wall 10, 10' (ref. FIG. 14). Upper and lower rotary brushes 83, 84 extending in the direction normal to the plane of the sheet of FIG. 14 are supported and housed in the space 82 in a manner such that they are freely rotative.

Figure 13:
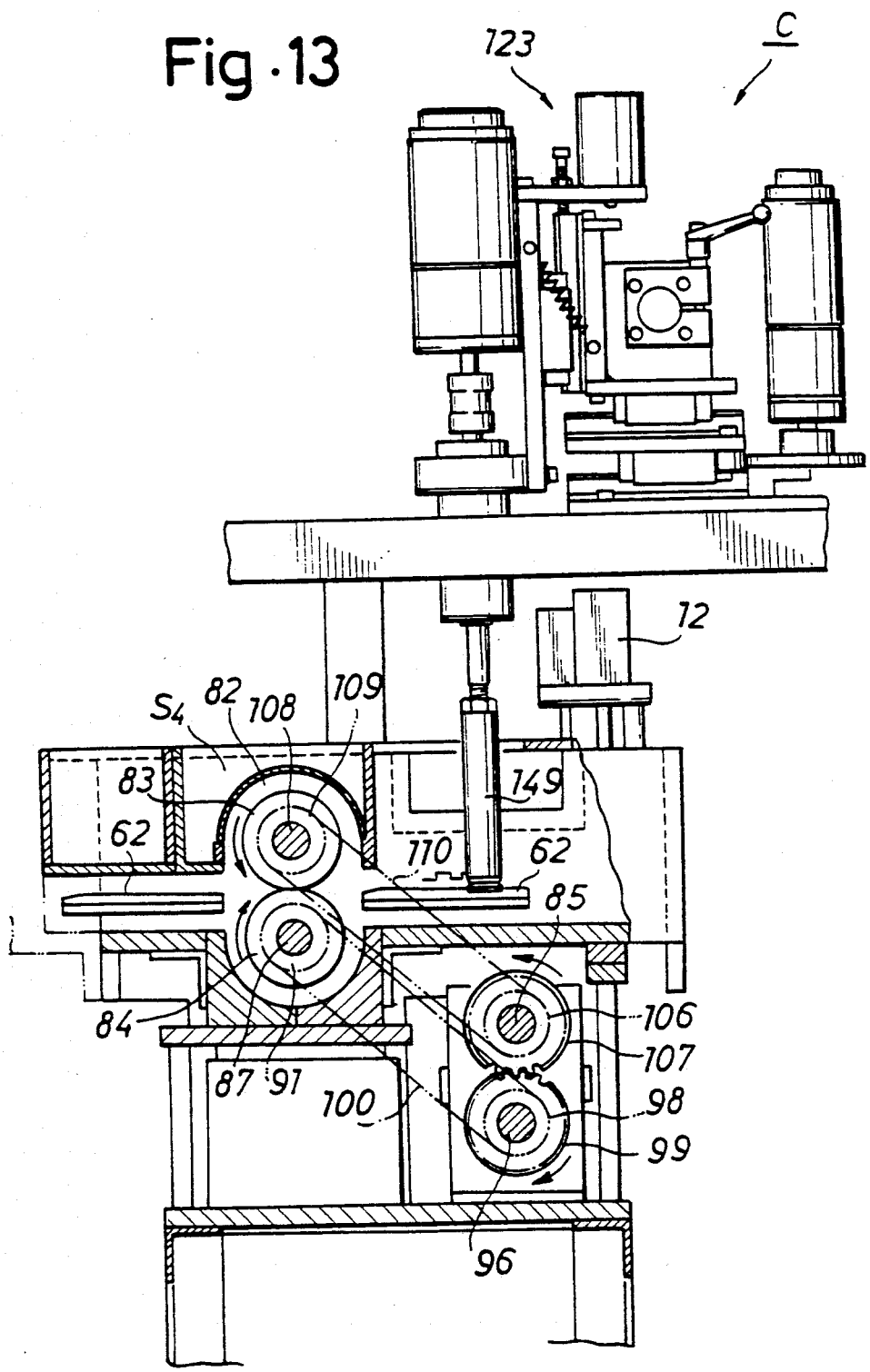
FIG. 13 is a partially broken-off side view of a scrubber section.

Incidentally, transportation mechanisms 62, 62 similar to the one described above are provided upstream to and downstream to the rotary brushes 83, 84, respectively, for transportation of the wafer W rightward as viewed in FIG. 13.

Cloth brush is adhered to the brushing surface of the rotary brushes 83, 84. The rotary brushes 83, 84 are driven independently to turn in opposite directions as indicated by the rounded arrows near them in FIG. 13. The position of the rotation axis of the lower rotary brush 84 is fixed relative to the container S4, whereas the shaft of the upper rotary brush 83 is supported by a frame arm 102 which can swing about rotation shafts 85, 86 (ref. FIG. 14) so that the upper rotary brush 83 can change its position relative to the lower rotary brush 84.

As shown in FIG. 16, the end portions of a rotation shaft 87, which supports the lower rotary brush 84, penetrate the side walls 88, 88 of the container S4 and the tanks 16, 16 at either side, and extend farther to be rotatively supported by support blocks 90, 90 via bearings 89. One of the ends of the rotation shaft 87 is provided with a timing pulley 91. In FIG. 16, reference numeral 92 designates a drive motor whose output shaft 92a is connected via a coupling 97 to a rotation shaft 96, which is rotatively supported by support blocks 93, 94 via bearings 95. A timing pulley 98 is fixed about the middle portion of the rotation shaft 96. The free end of the rotation shaft 96 bears a gear 99. An endless timing belt 100 is wound around the timing pulley 98 and the timing pulley 91. Incidentally, seal rings 101 are provided at the locations where the rotation shaft 87 penetrates the side walls 88 and the tanks 16.

As shown in FIG. 13 and FIG. 17, above the rotation shaft 96 is disposed the rotation shaft 85, which is adapted to rotate freely. One end of the upper rotary brush 83 is supported by one end portion of the frame arm 102, the other end portion of which is pivotally supported by rotation shafts 85, 86.

As shown in FIG. 17, the rotation shaft 85 is supported by support blocks 104 and 105 via bearings 103. A timing pulley 106 is fixed about the middle portion of the rotation shaft 85, and about the free end of the rotation shaft 85 is fixed a gear 107, which meshes with the gear 99 shown in FIG. 13.

As shown in FIG. 17, the end portions of the rotation shaft 108, which supports the rotary brush 83, penetrate the side walls 88, 88 of the container S4 and the tanks 16, 16 at either side, like the rotation shaft 87, and extend farther to be rotatively supported by the end portion of the frame arm 102. A timing pulley 109 is fixed at one end of the rotation shaft 108, and an endless timing belt 110 is wound around the timing pulley 109 and the timing pulley 106.

Next, the construction of the sealing elements provided at the locations where the rotation shaft 108 penetrates the side walls 88 of the container S4 and the tanks 16 will be described in detail with reference to FIG. 18 and FIG. 19.

In each side wall 88 of the container S4 is made a bore 88a having a running track-like shape and in each tank 16 is made a circular bore 16a, and a rotation shaft 108 (rotary brush 83) penetrates the bore 88a and the bore 16a. The dimensions of the bores 88a and 16a are so adapted that they allow the rotation shaft 108 to idly shift in a lateral direction. The locations where the rotation shaft 108 penetrates the side walls 88 and the tanks 16 are sealed by means of washer-like seal rings 111, 111 which engage with the rotation shaft 108 in a manner such that they provide a slight clearance around the shaft 108. These seal rings 111, 111 are held by ring holders 112, 112 in a manner such that the seal rings 111, 111 are allowed to freely shift about the bores 88a and 16a, which shifting is forced by the lateral shifting of the rotation shaft 108 (rotary brush 83).

Incidentally, as shown in FIG. 16 and FIG. 17, the rotation shaft 86 is disposed in a position such that it is coaxial with and opposed to the rotation shaft 85 across the container S4, and is pivotally supported by support blocks 114, 114 via bearings 113, 113. A pin 115 and a pin 116 are planted normally at the end portions of the arm 102, and an intermediate portion of the arm 102 is connected to the rotation shaft 86, as shown in FIG. 14, the projected length l1 on the arm 102 between the pin 115 and the shaft 86 being greater than the projected length l2 between the pin 116 and the shaft 86 (l1>l2). A plurality of washer-like weights 117 and 118 are stacked on the pins 115 and 116, respectively. One end of a lever 119 is fixed about the rotation shaft 86, and a stopper cylinder 120 is installed fixedly in the vicinity of the other end of the lever 119. At the end of a rod 120a extending from the stopper cylinder 120 is provided a roller 121 which is freely rotative about its axis and adapted to come in contact with the lever 119. Incidentally, as shown in FIG. 14, in the vicinity of the middle position of the lever 119 is provided a stopper bolt 122 which can be adjusted to protrude and recede for regulating the rotation movement of the lever 119.

As shown in FIG. 13 and FIG. 14, a rotation drive mechanism 123 for rotating the wafer W is installed above the container S4. The details of the rotation drive mechanism 123 are shown in FIG. 14 and FIG. 15. A pair of parallel guides 125, 125 extending in the direction of wafer transportation (left-to-right direction in FIG. 14) are laid on a base 124 fixed above the container S4, and a movable base 126 is mounted on the guides 125, 125 to slide thereon. On this movable base 126 is provided a slide shaft 127 to extend in the direction normal to the plane of the sheet of FIG. 14, and a slide bush 128 is fitted on the outer periphery of the slide shaft 127 to slide therealong. Incidentally, as shown in FIG. 15, the movable base 126 is always biased in a direction (rightward direction as viewed in FIG. 15) by means of a pair of springs 129, 129 which are provided between the movable base 126 and the base 124. A cam follower 130 which is pivotally supported in the middle of the movable base 126 is in contact with the periphery of an eccentric cam 131 which is provided on the right side of the movable base 126, as viewed in FIG. 14. The eccentric cam 131 is driven to rotate by means of a drive motor 132 fixedly installed on the base 124, and is fixed about the end of an output shaft 133a of a gear head directly connected to the drive motor 132.

Horizontal slide bases 134 134, which are oblique to each other, are fixed one at an end of the slide shaft 127 and the other to the slide bush 128. On each slide base 134 is slidably engaged a movable base 135 which is adapted to slide along the respective slide base 134. On the front face of each movable base 135 is provided a vertically elongated guide 136. Incidentally, a clamp lever 137 for clamping the movable base 135 onto the slide shaft 127 is provided to the base 135.

Each guide 136 is engaged wtih a respective movable base 138 via a slider 139 in a manner such that the movable bases 138 slide vertically along the respective guides 136. Each movable base 138 is always biased downwardly by means of a spring 140 hooked between the movable base 138 and the movable base 135, and is usually kept at a position as shown in FIG. 14 which is determined as a stopper bolt 141 hits against the upper end of the guide 136. To this movable base 138 are connected an integrally combined body consisting of a drive motor 142 and a gear head 143, a hollow vertical cylinder 144 provided below the body, and an air cylinder 145 provided in rear of (to the right of, as viewed in FIG. 14) the body.

An output shaft 143a extending downwardly from the gear head 143 is connected via a coupling 148 to the upper end of a rotation shaft 147 which penetrates the hollow cylinder 144 in which it is rotatively borne on upper and lower bearings 146, 146. The lower end portion of the rotation shaft 147 is threadably received in the upper end portion of a wafer drive shaft 149. In the side surface of the lower end portion of the wafer drive shaft 149 is formed a V-notch groove 149a adapted to fit with the end of the wafer W.

As shown in FIG. 14, a rod 145a extends downwardly from the bottom of the air cylinder 145; and a stopper plate 150, against which the lower end of the rod 145a is disposed to touch, is attached to the movable base 135.

Figure 20:
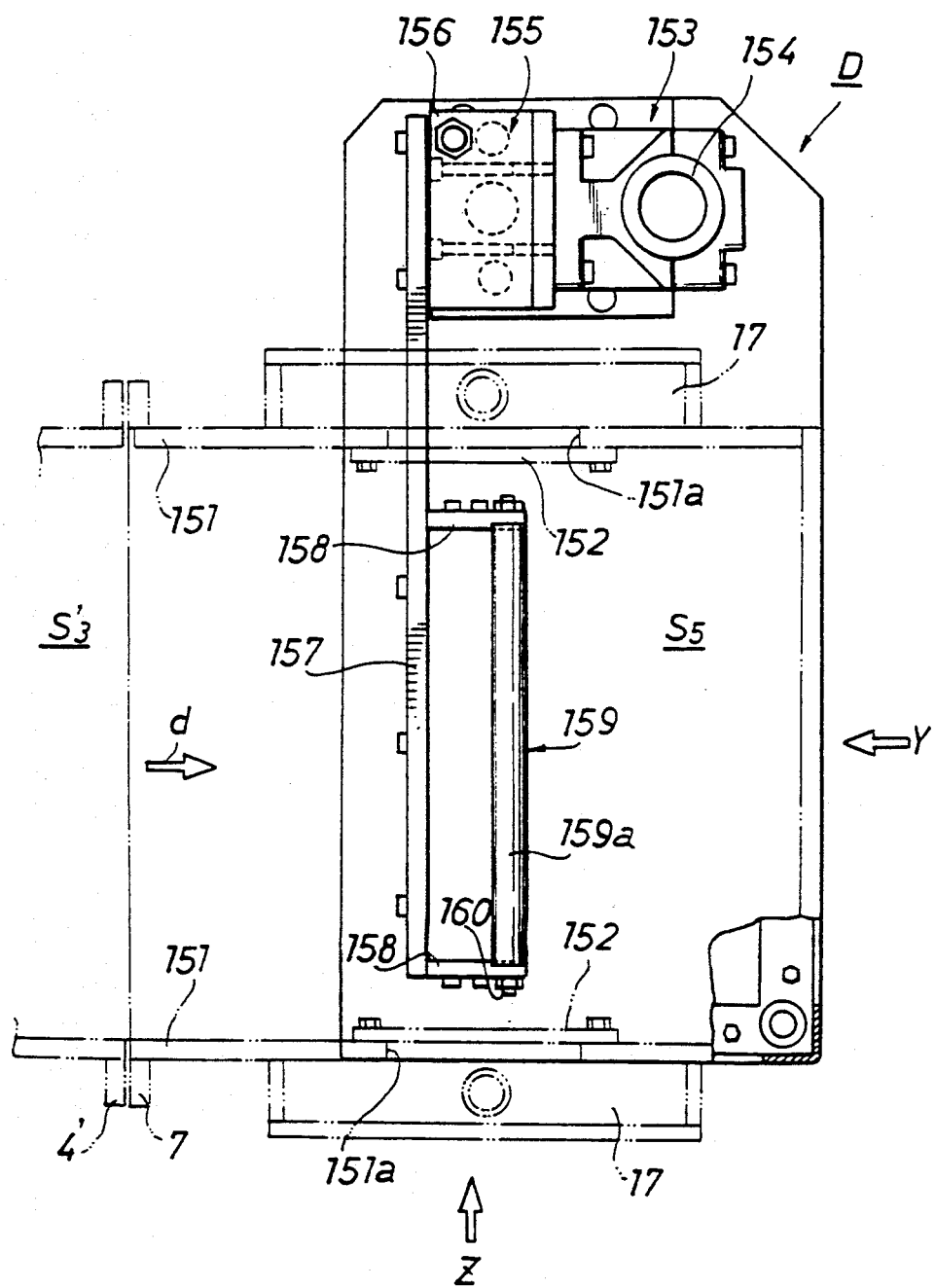
FIG. 20 is a plan view of the wafer receiver section.
Figure 21:
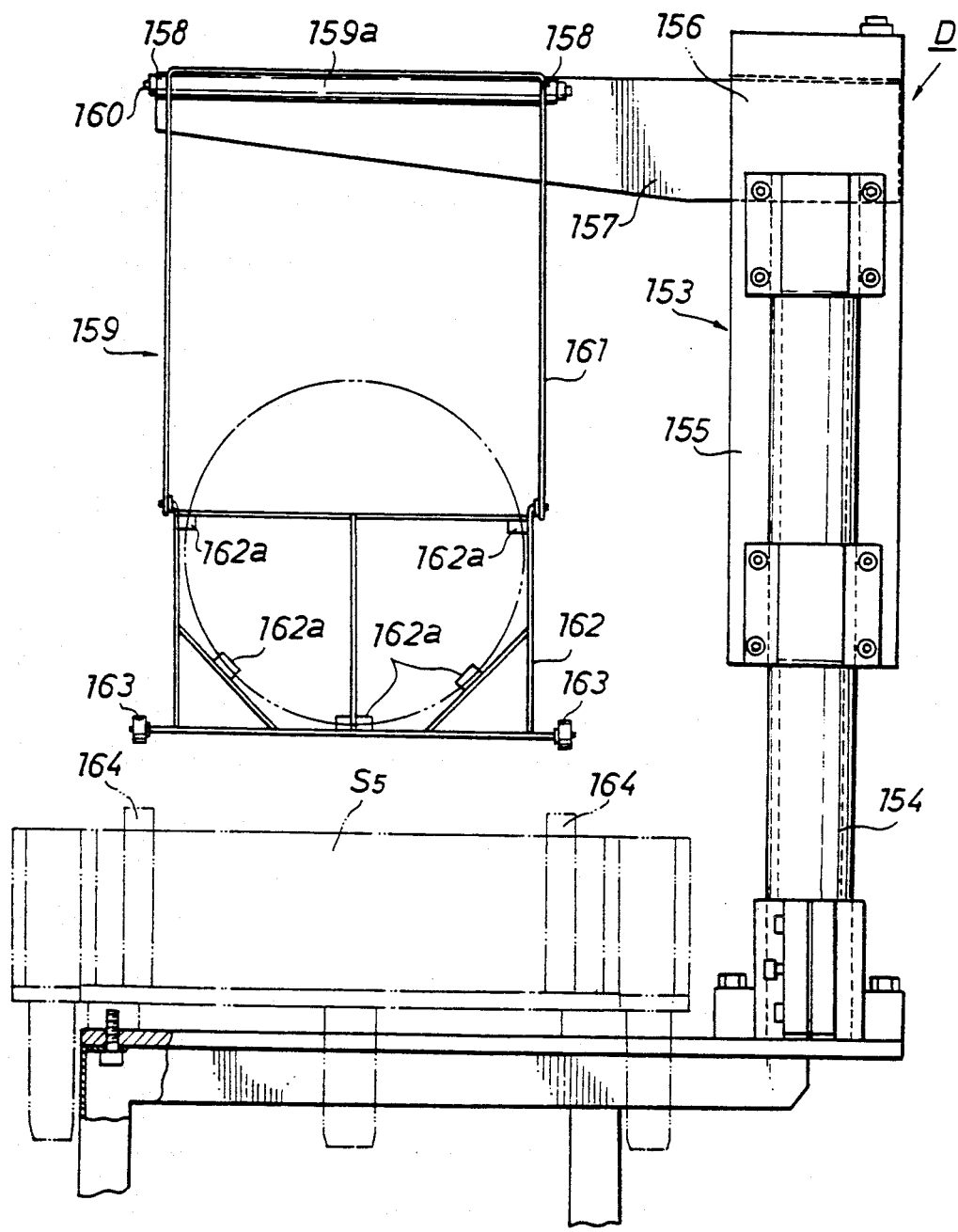
FIG. 21 is a view of the same receiver section seen from a direction indicated by the arrow Y of FIG. 20.
Figure 22:
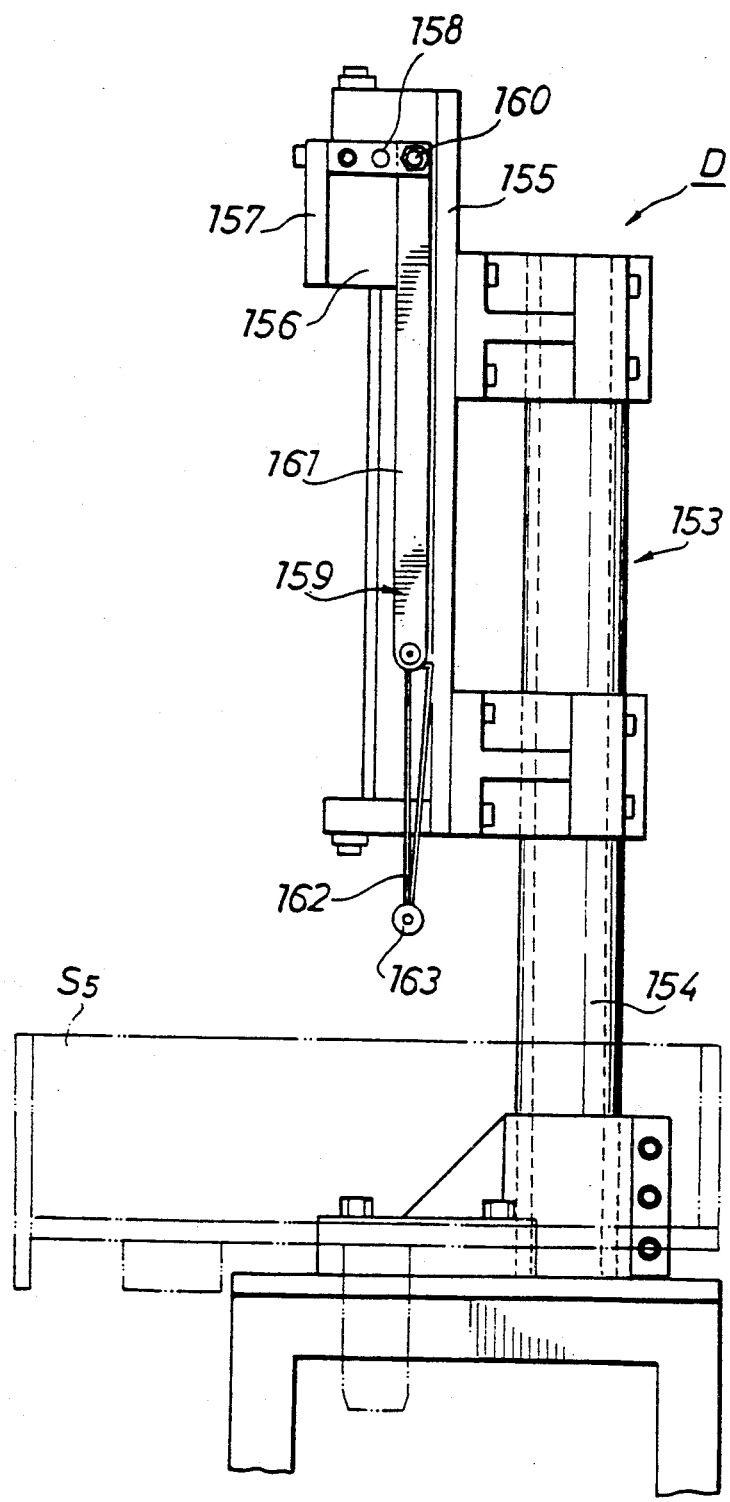
FIG. 22 is a view of the same receiver section seen from a direction indicated by the arrow Z of FIG. 20.
Figure 23:
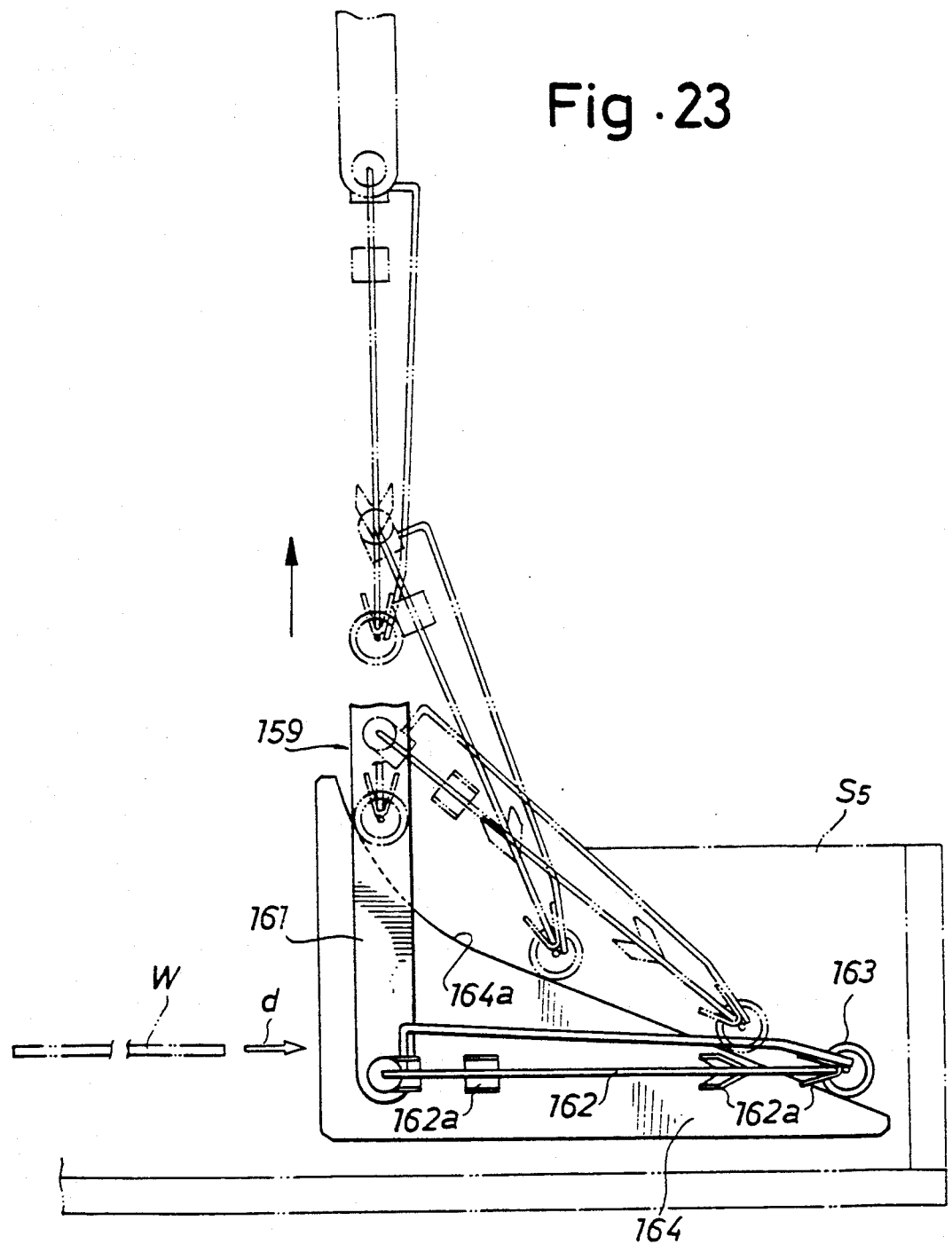
FIG. 23 is a drawing useful for an explanation of the operation of the wafer receiver section (bucket member)

Next, the construction of the wafer receiver section D will be described in detail with reference to FIGS. 20 through 23. Incidentally, FIG. 20 is a plan view of the wafer receiver section D; FIG. 21 is a view of the same section D seen from a direction indicated by the arrow Y of FIG. 20; FIG. 22 is a view of the same section D seen from a direction indicated by the arrow Z of FIG. 20; and FIG. 23 is a drawing useful for an explanation of the operation of the wafer receiver section D (bucket member).

A transportation mechanism (not shown) similar to the transportation mechanism 62 is installed in the container S5, and a rectangular cutaway port 151a, which provides an overflow passage from the container S5 to the tank 17, is made in each side wall 151 of the container S5. On the inside of the side wall 151 and across the cutaway port 75a is provided a rectangular weir plate 152, which can be shifted up and down for adjustment of the weir height.

Outside the container S5 in installed a recovery mechanism 153 for receiving and storing a wafer W after cleaning. This recovery mechanism 153 has a support post 154 which is erected at the side of the container S5, and a rodless cylinder 155 is supported by the post 154. This rodless cylinder 155 has a vertically slidable slider 156, to which is attached an arm 157 extending widthways of the container S5. A pair of horizontal stays 158 are affixed to a side of the arm 157, and an upper end boss 159a of a bucket 159 constituting a frame structure is pivotally supported by and between the stays 158, 158 by means of a bolt 160 in a manner such that the boss 159a is freely rotative about its axis of rotation.

The bucket 159 is composed of a support member 161 formed by folding a rectangular plate into a shape having a cross section resembling a Japanese letter " " and a recovery member 162 pivotally supported by the support member 161 in a manner such that the recovery member 162 is freely rotative about the pivoted end. The recovery member 162 is a bag made up of wires, and as shown in FIG. 23, the opening of the bag is made in the upper end of it, and at either side of the lower end of it are pivotally supported guide rollers 163, 163.

As shown in FIG. 23, two cam plates 164, 164 are provided right below the respective guide rollers 163, 163 of the bucket 159 in the container S5, and each cam plate 164 has a cam face 164a on which the respective guide roller 163 of the bucket 159 is adapted to land and roll along. Incidentally, the cam face 164a has a curved profile such that the height of the cam face 164a decreases with the distance increasing in the direction of wafer transportation (that is, left-to-right direction, as viewed in FIG. 23).

Next, the operation of the automatic cleaning apparatus 1 will be described.

First, at the wafer feeder section A, a large number of wafers W are stored one over the other, as described earlier, in the cassette 30 set on the cassette mount 28 in the container S1, and the whole body of the cassette 30 is submerged in the pure water contained in the container S1.

The wafers W are pushed out from the cassette 30 one by one by means of the pusher 21 beginning with the wafer at the top and going down successively.

In particular, the rodless cylinder 23 of the pusher 21 is driven to thereby cause the slider 25 to shift along the rod guides 24, 24 in the direction indicated by the arrows in FIG. 4 and FIG. 5, whereupon the push rod 26 and the pusher plate 27, which are integral with the slider 25, shift in the same direction. Thus, the pusher plate 27 comes in contact with the periphery of the wafer W which is at the top of the stack of the wafers, and pushes the wafer W out of the cassette 30. In synchronism with this motion, the shutter device 12 provided on the partition wall 8 is driven to open. The operation of the shutter device 12 on this occasion will be explained with reference to FIGS. 8 through 10.

FIG. 8 and FIG. 9 show the shutter device 12 when it is closed, and at this time, the opening 8a formed in the partition wall 8 is closed by means of a valve sheet 48. This closing condition is attained as the rod 46a of the air cylinder 46 is pushed out downwardly and presses the arm 59 to thereby urge the arm 59, the shaft 54 and the press body 55 to rotate in the direction indicated by the curved arrow in FIG. 9 opposing the force of the spring 60, so that the press piece 57 of the press body 55 presses the valve sheet 48 upon the surface of the partition wall 8 with a predetermined force, as shown in FIG. 9.

Simultaneously as the pusher 21 is driven, the air cylinder 46 is driven to withdraw its rod 46a upward to thereby allow the spring 60 to pull and turn the arm 59, the shaft 54, and the press body 55 in the direction indicated by the curved arrow in FIG. 10. As a result, the press piece 57 ceases to press the valve sheet 48 upon the partition wall 8.

Next, the air cylinder 45 is driven to withdraw the rod 45a upward together with the shutter body 47 and the valve sheet 48, as shown in FIG. 10, and as a result, the slit opening 8a formed in the partition wall 8 is unshuttered to thereby let the containers S1 and S2 communicate with each other via the opening 8a. Thus each wafer W, supplied by the pusher 21 one, by one is passed through the unshuttered openings 57a and 8a into the container S2, as shown in FIG. 10. Incidentally, while the shutter device 12 is opened, and thus while the containers S1 and S2 are in communication with each other, it is not desirable that the pure water flows from one of the container to the other. In this embodiment of the invention, the container S1, for example, is provided with a weir plate 32, and by adjusting the height of the weir plate 32 with the use of the bolts 33, as shown in FIG. 4 and FIG. 5, it is possible to adjust the level of the pure water in the container S1, so that the static pressure at the opening 8a in the container S1 can be kept roughly equal to that in the container S2, and as a result, the flow of the pure water through the opening 8a can be minimized. Also, a turbulence of the pure water in the vicinity of the opening 8a is not desirable from the view point of the maintenance of high quality of the wafers W; in this connection, in the embodiment of the invention, the film thickness of the valve sheet 48 is made as small as possible so that the vertical movement of the valve sheet 48 scarcely causes a turbulence of the pure water in the vicinity of the opening 8a.

When the wafer W is transported into the container S2, the air cylinder 45 is driven again to push its rod 45a downward so that the valve sheet 48 descends to a position for covering the opening 8a. Next, the air cylinder 46 is driven to push its rod 46a downward so that the lower end of the rod 46a comes in contact with and presses downward the arm 59 whereby the arm 59, the shaft, and the press body 55 are caused to rotate in one body in the direction indicated by the arrow in FIG. 9; as a result, the valve sheet 48 is pressed onto the partition wall 8 by means of the press piece 57 of the press body 55, as shown in FIG. 9, to thereby entirely close the opening 8a with the valve sheet 48 for interruption of the communication between the containers S1 and S2.

When the wafer W at the top of the wafer stack in the cassette 30 is pushed out by the pusher 21, the drive motor 37 of the cassette mount drive mechanism 22, shown in FIG. 6, is driven and the rotation torque generated thereby is transmitted to the ball screw shaft 39 by way of the gears 38, 40 whereby the ball screw shaft 39 is turned. As the ball screw shaft 39 is turned, the slider 41, which is threadably penetrated by the ball screw shaft 39, is caused to rise by a predetermined amount of altitude, guided by the rod guides 42, 42, carrying with it through the same amount of altitude the rods 29, 29 affixed to the slider 41, the cassette mount 28 supported by these rods 29, 29, and the cassette 30 set on the cassette mount 28. As the result, the wafer W stored in the berth immediately beneath the one emptied most recently is brought up to a waiting position at which the wafer can be touched and pushed out by the pusher plate 27 of the pusher 21. Thus, the same wafer supply operation is repeated.

The wafer W, thus transported into the container S2, is carried by the transportation mechanism 62 installed in the container S2, and when the wafer W is detected by a sensor (not shown) to have passed a predetermined position in the container S2, the shutter device 12 installed on the partition wall 9 opens to allow the wafer W to pass through an opening (not shown) made in the partition wall 9 and to be transported into the container S3 of the isolator section B.

In the isolator section B, the wafer W brought into the container S3 is transported farther in the direction indicated by the arrow in FIG. 11 and FIG. 12 along the guide plates 72, 72 by means of the transportation mechanism 62 installed in the container S3. In particular, in the transportation mechanism, the pressurized water is supplied into the fluid passage 68 and, after passing through the circular through holes 70 and the fluid passage 67, ejected slantwise into the container S3 from the jet holes 71. Then, the wafer W is transported in the direction of the arrow in FIG. 11 and FIG. 12 by means of the jet ejected from the jet holes 71.

When the wafer W is detected by a sensor such as a photoelectric switch, provided in the lid member 73 to have passed the sensor, the rotary actuator 79 is driven in a manner such that the shaft 77 is turned in a direction indicated by the curved arrow drawn in broken line near the shaft 77 in FIG. 12, whereby the stopper member 78 turns through an angle of 90 degrees to asssume the vertical position (drawn in solid line) from the horizontal position (drawn in broken line) and, as a result, the wafer W, transported in the pure water in the container S3, is temporarily stopped by the stopper member 78.

Thereafter, the rotary actuator 79 is driven again in a manner such that the shaft 77 is turned in the reverse direction indicated by the curved arrow drawn in solid line near the shaft 77 in FIG. 12, to thereby turn the stopper member 78 through a reversed angle of 90 degrees to assume the horizontal position again so that the wafer W is allowed to pass thereunder. Simultaneously as this, the shutter device 12 provided on the partition wall 10 opens, and the wafer W passes through the opening 10a (ref. FIG. 14) formed in the partition 10, and is transported into the cleaning liquid contained in the container S4 of the scrubber C. When the wafer W is clearly brought into the container S4, the opening 10a is closed again with the shutter device 12, so that the communication between the containers S3 and S4 is interrupted. Incidentally, as described above, it is not desirable that the pure water or the cleaning liquid should pass through the opening 10a; in order to prevent this, the static pressures of the pure water and the cleaning liquid working at the opening 10a should be kept roughly equal to each other, and this is attained, for example, by adjusting the level of the pure water in the container S3 by means of the adjustable weir plate 81.

The wafer W transported into the container S4 of the scrubber section C is farther transported through the cleaning liquid toward the rotary brushes 83, 84 by means of the transportation mechanism 62 installed in the container S4. On this occasion, the upper brush 83 is lifted up a little to thereby create a space of a predetermined dimension between the upper and the lower brushes 83, 84. In particular, the stopper cylinder 120, shown in FIG. 14, is driven in a manner such that the rod 120a is pushed out to thereby cause the roller 121 pivotally supported at the end of the rod 120a to hit upon and press the lever 119 whereby the lever 119 turns clockwise, as viewed in FIG. 15, together with the arm 102; thus, the upper rotary brush 83 pivotally supported by the arm 102 is swung a little upward about the rotation shafts 85, 86 to thereby create the space of the predetermined dimension between the two rotary brushes 83, 84.

At this time, the wafer drive shafts 149, 149 are lowered to their lowermost positions, as in FIG. 14, to wait for the wafer W. In particular, as shown in FIG. 14, the rod 145a of the air cylinder 145 is pulled up to be thereby detached from the stopper plate 150, whereupon the movable bases 138 descend along the guides 136 together with the wafer drive shafts 149, etc. by their own weights until it stops as the lower end of the stopper bolt 141 attached to the movable base 138 is stopped by the upper end of the guide 136. As a result, each wafer drive shaft 149 assumes the lowermost waiting position, as described above. It is possible to finely adjust this lowermost waiting position of the shaft 149 by the turning the stopper bolt 141 to modify its vertical position.

Thus, the wafer W in the container S4 is caused to pass in the space made between the upper and lower rotary brushes 83, 84, and stops as its periphery comes in fit contact with the grooves 149a, 149a of the wafer drive shafts 149, 149. Thereupon, the stopper cylinder 120, shown in FIG. 14, is driven again in a manner such that the rod 120a is withdrawn to detach the roller 121 from the lever 119. On this ocassion, since the weights 117 and 118 are hooked on the arm 102 at distances l1 and l2 (l1 > l2), respectively, from the rotation shafts 85, 86, as described above, such that the product of the gravity of the weights 117 and l1 is greater than that of the gravity of the weights 118 and l2, the moment that urges the arm 102 to rotate anticlockwise overcomes the clockwise moment, as viewed in FIG. 14, and thus the arm 102 turns anticlockwise about the rotation shafts 85, 86. As a result, the wafer W is pressed between the upper and lower rotary brushes 83, 84 by a predetermined pressure. Incidentally, it is possible to arbitrarily adjust the pressure the wafer W receives from the rotary brushes 83, 84 through a modification of the balance between the moments about the shafts 85, 86 by changing the number of the weights 117 and 118, respectively.

As the upper rotary brush 83 is swung a little about the rotation shafts 85, 86, the rotation shaft 108, which supports the brush 83, shifts within the bores 88a made in the side walls 88 and the bores 16a made in the tanks 16, but since the positions at which the rotation shaft 108 penetrates the side walls 88 and the tanks 16 are sealed by means of the seal rings 111, 111, which are adapted to slide along the bores 88a and 16a, the cleaning liquid is prevented from leaking through these positions. Incidentally, even the cleaning liquid happens to leak at the bores 88a of the side walls 88, the leaked cleaning liquid flows into the tank 16 and cannot reach the bore 16a of the tank 16 so that it is impossible that the cleaning liquid leaks out of the tank 16.

When the wafer W is inserted between the upper and the lower rotary brushes 83, 84, these rotary brushes 83, 84 are driven to rotate in the respective directions indicated by the arrows in FIG. 13. In particular, as the drive motor 92 is driven, the rotational torque is transmitted to the rotation shaft 96 via the coupling 97, shown in FIG. 16, and the rotation torque of the rotation shaft 96 is transmitted to the rotation shaft 87 via the timing pulley 98, timing belt 100, and the timing pulley 91 whereby the rotation shaft 87 and the lower rotary brush 84 supported thereby are caused to rotate in the direction indicate by FIG. 13. Simultaneously as this, the rotational torque of the rotation shaft 96 is transmitted to the rotation shaft in FIG. 17, via the gears 99 and 170, and then the rotational torque of the rotation shaft 85 is transmitted to the rotation shaft 108 via the timing pulley 106, the timimg belt 110, and the timimg pulley 109, whereby the rotation shaft 108 and the upper rotary brush 83 supported thereby are driven to rotate in the direction indicated by FIG. 13.

Figure 25:
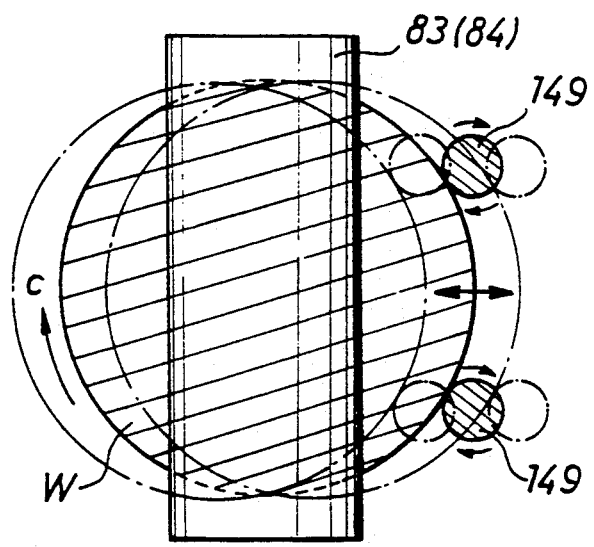
FIG. 25 is a plan view of the same operation.

Simultaneously at this motion, the both wafer drive shafts 149, 149 are driven to rotate in the direction indicated by FIG. 25. In particular, as each drive motor 142, shown in FIG. 14, is driven, this rotational torque is transmitted to the wafer drive shaft 149 via the output shaft 143a of the gear head 143, the coupling 148, and the rotation shaft 147 whereupon the wafer drive shaft 149 is driven to rotate.

Figure 24:
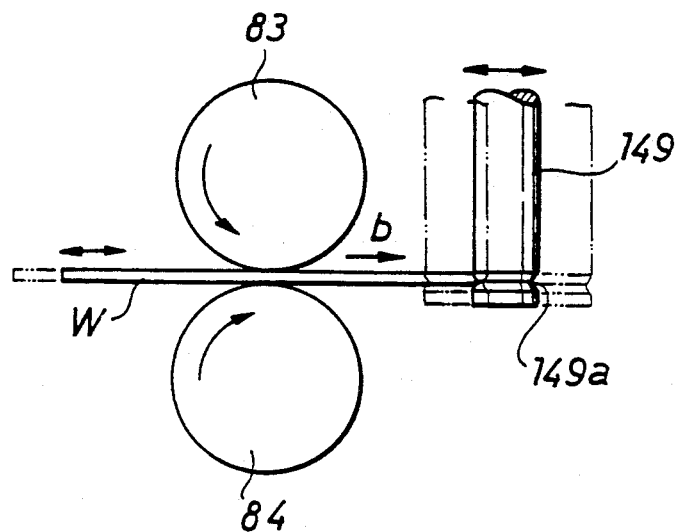
FIG. 24 is a side view showing the cleaning operation of a wafer.

Incidentally, the wafer W held between the currently rotating rotary brushes 83, 84 receives a propulsion in the direction indicated by the arrow b in FIG. 24 from the rotary brushes 83, 84, so that the peripheral edge of the wafer W is pressed against the grooves 149a, 149a of the wafer drive shafts 149, 149 and as the wafer drive shafst 149, 149 are driven to rotate, as described above, the wafer W with its periphery in contact with them is caused to turn horizontally in the direction indicated by the arrow C in FIG. 25. In this embodiment, the drive motor 132 is also driven at this time, and its rotational torque is transmitted to the eccentric cam 131 by way of the output shaft 133a of the gear head 133 to thereby drive the eccentric cam 131 to turn. As this eccentric cam 131 turns, the movable base 126 integral with the cam follower 130, which is in contact with the eccentric cam 131, is caused to reciprocate along the guides 125, 125 leftward and rightward, as vieewed in FIG. 14. As a result, the wafer drive shafts 149, 149 supported by the movable base 126 similarly reciprocates to thereby cause the wafer W in contact with the wafer drive shafts 149 to reciprocate between the rotary brushes 83, 84, as shown in FIG. 24 and FIG. 25, by a predetermined amplitude of stroke.

As described above, since the wafer W is cleaned by the rotary brushes 83, 84 while the wafer W is at once turned and reciprocated horizontally, the impurities sticking to the both sides of the wafer W are removed from the wafer at once and completely.

When the cleaning of the both sides of the wafer W is completed, the drive motors 142 and 132 are stopped to thereby terminate the rotation and reciprocation of the wafer drive shafts 149, 149.

Now, it is so arranged that when the rotary brushes 83, 81 are caused to stop rotating, they stop only after turning reversely through an angle of 30 degrees. As a result, the wafer W held between these rotary brushes 83, 84 receives a propulsion in the direction away from the grooves 149a, so that the wafer W shifts back slightly and thus detaches its periphery from the grooves 149a, 149a of the wafer drive shafts 149, 149. Then, the air cylinder 145, shown in FIG. 14, is driven such that its rod 145a is pushed downward and, as the lower end of the rod 145a comes in contact with and presses downward the stopper plate 150, the movable base 138 receives a reaction force and slides upward together with the drive motor 142, the gear head 143, the rotation shaft 147, the wafer drive shaft 149, etc., which are attached to the movable base 138, whereby it becomes possible for the wafer W to proceed past the wafer drive shafts 149.

Thereafter, as the rotary brushes 83, 84 are rotated in the respective directions indicated by the curved arrows in FIG. 24, the wafer W held between the brushes 83, 84 is sent out and is conveyed toward the shutter device 12 by means of the conveyor mechanism 62 installed in the container S4.

The shutter device 12 opens at an appropriate timing such that the wafer W is allowed to pass therethrough from the container S4 to the container S3' of the isolator section B', and when the wafer W has clearly passed, the shutter device 12 closes to thereby interrupt the communication between the container S4 and the containers S3'. The wafer W brought into the container S3' of the isolator section B' is transported through the pure water by means of the transportation mechanism installed in the container S3 whereby the wafer W rids itself of the cleaning liquid sticking to its surfaces.

When it is detected by a sensor, not shown, that the wafer W has passed a predetermined position in the container S3', the shutter device 12 installed on the partition wall 11 assumes the open position to thereby allow the wafer W to pass through the opening (not shown) of the partition wall 11 and be transported into the container S5 of the wafer receiver section D. Thereafter, the shutter device 12 assumes the close position to interrupt the communication between the containers S3' and S5.

Similarly as in the above instance, it is not desirable that the pure water in the container S3' and the pure water in the container S5 flow into each other; such flow of pure water is prevented, for example, by adjusting the height of the weir plate 152, shown in FIG. 20, to change the level of the pure water in the container S5 in a manner such that the static pressures working at the opening (not shown) formed in the partition 11 are roughly equated.

When the size of the wafers W to be cleaned is changed, the clamp lever 137, shown in FIG. 14 and FIG. 15, is turned in the direction of unclamping the movable base 135, which is then made to slide along the slide base 134 to thereby horizontally shift the position of the wafer drive shafts 149, which is supported by the movable base 135, whereby it is possible to cope with the wafers W of different sizes.

The wafer W transported into the container S5 of the wafer receiver section D is further transported in the direction indicated by the arrow d in FIG. 23 by means of the fluid ejected from the trasnportation mechanism 62 installed in the container S5. At this moment, the vertical bucket 159 is assuming its lowest position and the recovery member 162 its horizontally crouching position, as shown in solid line in FIG. 23, with its opening facing leftward, as viewed in the same figure. With the things arranged thus, the wafer W, which is conveyed in the pure water in the direction d in FIG. 23, enters into the horizontally turned recovery member 162 through the opening thereof. When the wafer W is detected to have entered the recovery member 162, the rodless cylinder 155 is driven in a manner such that the arm 157 together with the bucket 159 is raised. As the bucket 159 thus ascends, the guide rollers 163, 163 pivotally supported at the lower end of the recovery member 162 roll on along the cam faces 164a, 164a of the cam plates 164, 164 whereby the recovery member 162 rises and goes up gradually as shown in two-dot chain line in FIG. 23; thus the wafer W recovered in the recovery member 162 is scooped up by the recovery member 162 from the pure water contained in the container S5; the wafer W is steadied by a plurality of V-letter-shaped wafer stays 162a (ref. FIG. 23) which are fixed on the recovery member 162, as shown in FIG. 21.

Now, as described above about the series of operation steps for cleaning the wafer W, the inventive apparatus 1 is equipped with such facilities that the enable fully automated operation series of cleaning the wafer W, starting with inputting of the wafers and up until recovery of the wafers after cleaning them. Especially, at the scrubber section C, since the both faces of the wafer W are simultaneously cleaned by means of a pair of upper and lower rotary brushes 83, 84, the cleaning of the wafers can be conducted highly effectively within a reduced period of time, so that the operation efficiency and cleaning capacity are improved and the total cleaning operation is economized.

According to the apparatus of the invention, each wafer W is always kept in the pure water throughout the whole series of the cleaning operation beginning with the inputting of the wafer W into the apparatus and ending with the recovery of the wafer W after cleaning it, so that the wafer W is prevented from drying, and as a result, the wafer W is effectively kept clean of dust and scars.

Incidentally, in the embodiment described above, the fully automated cleaning apparatus 1 is constituted of one of each section, namely the wafer feeder section A, the isolator section B, the scrubber section C, and the wafer receiver section D, but it is possible to employ more than one unit of any section, if need be.

It is to be understood by those skilled in the art that the foregoing description is a preferred embodiment of the disclosed apparatus and that various changes and modifications may be made in the invention without departing from the spirit and scope thereof.

What is claimed is:

1. An automatic cleaning apparatus for diskshaped workpieces, comprising the following sections detachably connected in a row in the following order to form a fluid passage:

a work feeder section equipped with a work transportation means, for supplying the workpieces to be cleaned one by one into said fluid passage in a manner such that each workpiece is always kept in a liquid, a first isolator section equipped with a workpiece transportation means, for isolating a scrubber section from the workpiece feeder section by means of a liquid, through which the workpiece is transported, said scrubber section being equipped with a workpiece transportation means and a scrub means which is adapted to receive a workpiece and clean the both faces, at once, of the workpieces within a liquid, A second isolator section equipped with a workpiece transportation means, for isolating a workpiece receiver section from the scrubber section by means of a liquid, through which the workpiece is transported, and said workpiece receiver section being equipped with a workpiece transportation means, for receiving the cleaned workpiece within a liquid through which the workpiece is transported, and recovering the same from the liquid.

2. An automatic cleaning apparatus as claimed in claim 1, wherein said workpiece feeder section, said scrubber section, said isolator sections, and said workpiece receiver section are detachable units connected in a row to form said passage which can be interrupted at each connection by means of a shutter device provided at each connection.

3. An automatic cleaning apparatus as claimed in claimed 2, wherein said shutter comprises:

a valve sheet made of a film normally held in parallel with the partition wall at each connection and adapted to open and close an opening made in a partition wall by shifting in a direction parallel with the partition wall across said opening, a press means for pressing said valve sheet over said opening in the partition wall to hermetically close said opening, and a drive means for driving said press means and said valve sheet.

4. An automatic cleaning apparatus as claimed in claim 1, wherein said workpiece transportation means has a workpiece passage and a plurality of jet holes slantingly opening in the workpiece passage such that the ejected jets lift and carry the submerged work downstream.

5. An automatic cleaning apparatus as claimed in claim 1, wherein said workpiece feeder section, said scrubber section, said isolator sections, and said workpiece receiver section are each provided with a container and a tank on either side wall of each container for receiving and draining the liquid which overflows from said container of each section.

6. An automatic cleaning apparatus as claimed in claim 5, wherein said container of each section is provided with a weir plate each on either side wall of said container which is vertically shiftable to regulate the overflow rate.

7. An automatic cleaning apparatus as claimed in claim 1, wherein said work feeder section has a drive mechanism adapted to move a cassette, containing workpieces in layers with a space between neighboring layers, upward or downward by a predetermined amount at a time, and a pusher adapted to push out the workpieces one by one from said cassette.

8. An automatic cleaning apparatus as claimed in claim 1, wherein said scrub means comprises a pair of rotary brushes having axes of rotation parallel with each other and adapted to receive the workpiece therebetween and clean the workpiece by turning in opposite directions about their axes, a first workpiece drive means to rotate the workpiece horizontally between said rotary brushes, and a second workpiece means to reciprocate the workpiece horizontally through a predetermined amplitude of stroke.

9. An automatic cleaning apparatus as claimed in claim 8, wherein at least one of said rotary brushes is adapted to move in a direction such that the distance between the axes of rotation of the rotary brushes is altered.

10. An automatic cleaning apparatus as claimed in claimed 9, wherein said movable rotary brush is pressed upon the other rotary brush with a controllable force.

11. An automatic cleaning apparatus as claimed in claim 10, wherein said movable rotary brush is supported by lever means which turns to thereby alter the distance between the axes of rotation of the rotary brushes, and which carries at its ends weight means which determines the controllable force with which the mavable rotary brush is pressed upon the other rotary brush.

12. An automatic cleaning apparatus as claimed in claim 9, wherein said movable rotary brush is supported by a lever means which turns to thereby alter the distance between the axes of rotation of the rotary brushes, and which carries at its ends weight means which determines the controllable force with which the movable rotary brush is pressed upon the other rotary brush.

13. An automatic cleaning apparatus as claimed in claimed 9, wherein the positions where the shaft of said movable rotary brush penetrates the container of the scrubber section are sealed with seal rings which are fixed on the periphery of the shaft and slidably engaged in the running track-shaped bores made in the side wall of the container of the scrubber section to receive the shaft.

14. An automatic cleaning apparatus as claimed in claim 1, wherein said work receiver section is equipped with a bucket for recovering the work within the liquid and a pair of ramped stationary can means, which bucket comprises a vertically shiftable support member and a bag-shaped recovery member which is pivotally supported by said support member, and pivotally supporting a pair of guide rollers at its lower end placed on said cam means, and adapted to assume a vertical off-liquid position and a horizontal in-liquid position, and which cam means are so profiled that as the guide rollers roll along the cam means the bag-shaped recovery member shifts from said vertical off-liquid position to said horizontal in-liquid position, and vice versa.

* * * * *